(12) United States Patent
Weng et al.

(10) Patent No.: US 9,412,724 B2
(45) Date of Patent: Aug. 9, 2016

(54) CHIP-SCALE PACKAGED LED DEVICE

(71) Applicants: LITE-ON OPTO TECHNOLOGY (CHANGZHOU) CO., LTD., Jiangsu Province (CN); LITE-ON TECHNOLOGY CORP., Taipei (TW)

(72) Inventors: Ming-Kun Weng, Taipei (TW); Kuo-Ming Chiu, Taipei (TW); Shih-Chiang Yen, Taipei (TW); Meng-Sung Chou, Taipei (TW); Chen-Hsiu Lin, Taipei (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/689,315

(22) Filed: Apr. 17, 2015

(65) Prior Publication Data
US 2015/0311249 A1     Oct. 29, 2015

(30) Foreign Application Priority Data

Apr. 23, 2014 (CN) .......................... 2014 1 0166461
Dec. 3, 2014 (CN) .......................... 2014 1 0725064

(51) Int. Cl.
| | |
|---|---|
| *H01L 29/18* | (2006.01) |
| *H01L 25/075* | (2006.01) |
| *H01L 33/58* | (2010.01) |
| *H01L 33/62* | (2010.01) |
| *H01L 33/48* | (2010.01) |
| *H01L 33/54* | (2010.01) |

(52) U.S. Cl.
CPC ............ *H01L 25/0753* (2013.01); *H01L 33/486* (2013.01); *H01L 33/54* (2013.01); *H01L 33/58* (2013.01); *H01L 33/62* (2013.01); *H01L 2924/0002* (2013.01)

(58) Field of Classification Search
CPC ... H01L 33/54; H01L 25/0753; H01L 33/486; H01L 33/58
See application file for complete search history.

(56) References Cited

U.S. PATENT DOCUMENTS

| | | | |
|---|---|---|---|
| 6,483,196 B1* | 11/2002 | Wojnarowski | H01L 33/20 257/432 |
| 2011/0049545 A1* | 3/2011 | Basin | H01L 33/56 257/98 |
| 2015/0207041 A1* | 7/2015 | Butterworth | H01L 33/507 257/98 |

\* cited by examiner

*Primary Examiner* — Bradley K Smith
(74) *Attorney, Agent, or Firm* — Rosenberg, Klein & Lee

(57) ABSTRACT

An LED device includes a substrate, a number (N) of flip-chip LED die(s), an electrical conductive structure and a lens structure. The substrate has upper and lower surfaces and is formed with multiple through holes. A ratio of LED die(s) surface area to an area of the upper surface of the substrate ranges from 22.7% to 76.2%. The electrical conductive structure includes a number (N) of upper bonding pad assembly (assemblies), a number (N+1) of lower bonding pads and a number (2N) of interconnectors. Each upper bonding pad assembly includes two upper bonding pads electrically connected to the LED die(s). The interconnectors are disposed in the through holes and interconnect the upper and lower bonding pads. The lens structure covers the LED die(s).

20 Claims, 19 Drawing Sheets

CHIP-SCALE PACKAGED LED DEVICE

CROSS-REFERENCE TO RELATED APPLICATION

This application claims priorities of Chinese Patent Application No. 201410166461.6, filed on Apr. 23, 2014 and Chinese Patent Application No. 201410725064.8, filed on Dec. 3, 2014.

FIELD

The disclosure relates to an LED device, more particularly to a chip-scale packaged LED device.

BACKGROUND

LED packaging technique is one of the focuses in the development of the semiconductor industry. Packaging technique for lateral LEDs and vertical LEDs by wire bonding, and packaging technique for flip-chip LEDs by flip-chip bonding are all being studied for improving brightness and reliability as well as reducing overall volume of the packaged LEDs.

In terms of packaging technique by flip-chip bonding, chip-scale packaged LED device has been developed for the purpose of miniaturization. However, there is still room for improvement regarding brightness, volume, reliability, yield, etc.

SUMMARY

Therefore, an object of the disclosure is to provide a chip-scale packaged LED device that is miniaturized and easy to manufacture. The chip-scale packaged LED device emits light with high brightness and has desirable reliability.

The effects of the present disclosure resides in the miniaturization, high emission brightness and desirable reliability of the chip-scale packaged LED device by virtue of structural designs of a substrate, flip-chip LED die(s), upper bonding pads, lower bonding pads, interconnectors, a lens structure, a reflection layer and an insulation layer of the chip-scale packaged LED device.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
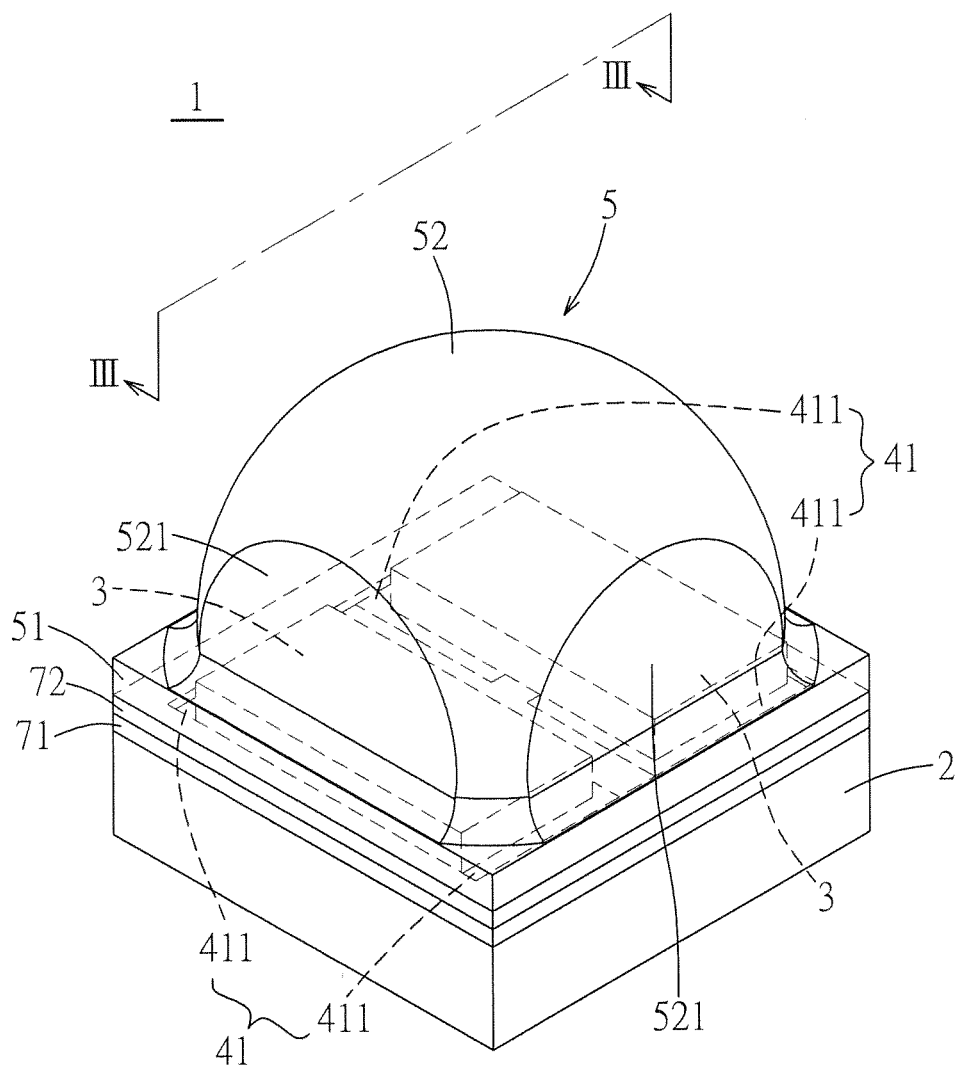
FIG. 1 is a perspective view of a first implementation of a first embodiment of a chip-scale packaged LED device according to the present disclosure.

Before the disclosure is described in greater detail with reference to the accompanying embodiments, implementations and variations, it should be noted herein that like elements are denoted by the same reference numerals throughout the disclosure.

Bottom views as described hereinafter are essentially top views of the same device when flipped upside down. In short, the device shown in FIG. 6 is the same as that shown in FIG. 5 but flipped upside down, the device shown in FIG. 8 is the same as that shown in FIG. 7 but flipped upside down, the device shown in FIG. 10 is the same as that shown in FIG. 9 but flipped upside down, the device shown in FIG. 12 is the same as that shown in FIG. 11 but flipped upside down, and the device shown in FIG. 23 is the same as that shown in FIG. 22 but flipped upside down.

First Embodiment

Figure 2:
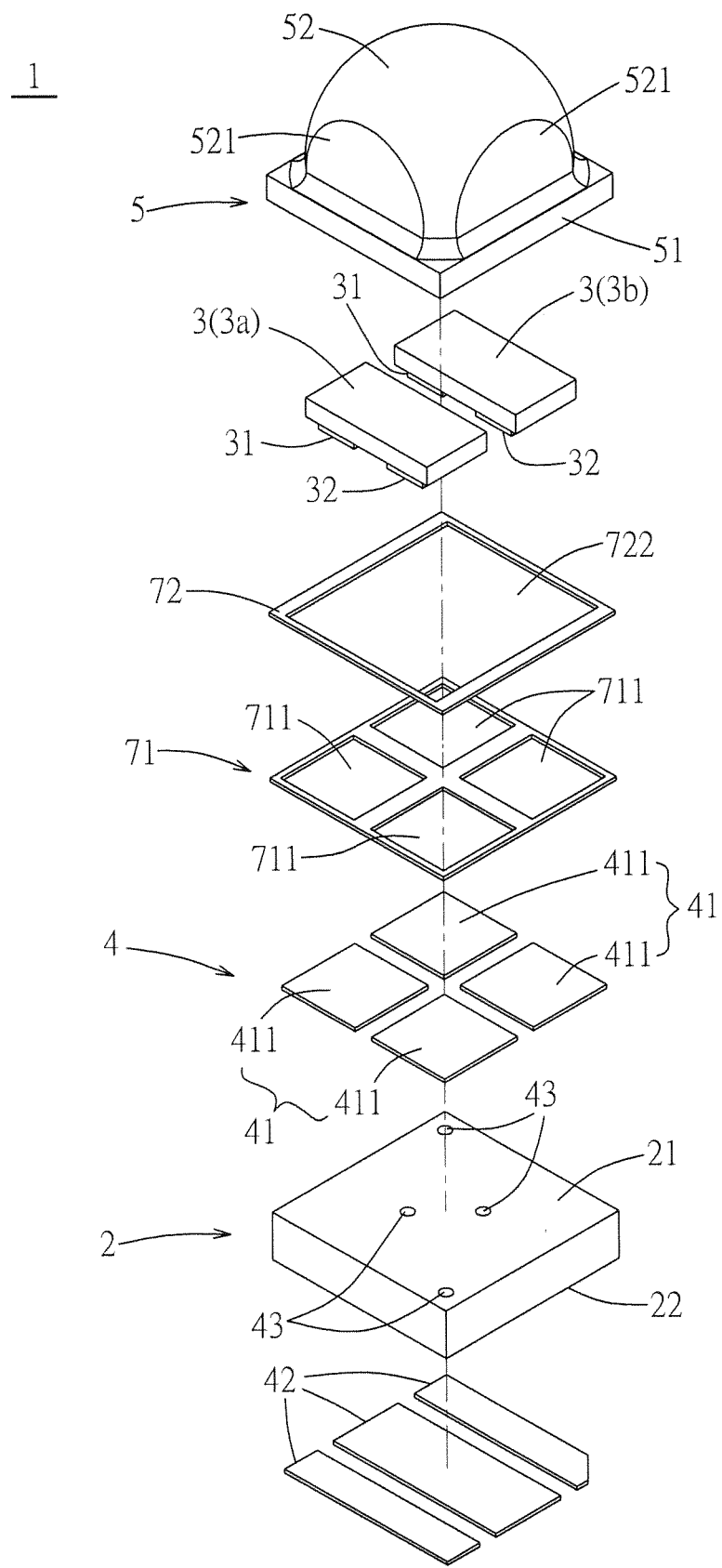
FIG. 2 is an exploded perspective view of the first implementation of the first embodiment.
Figure 3:
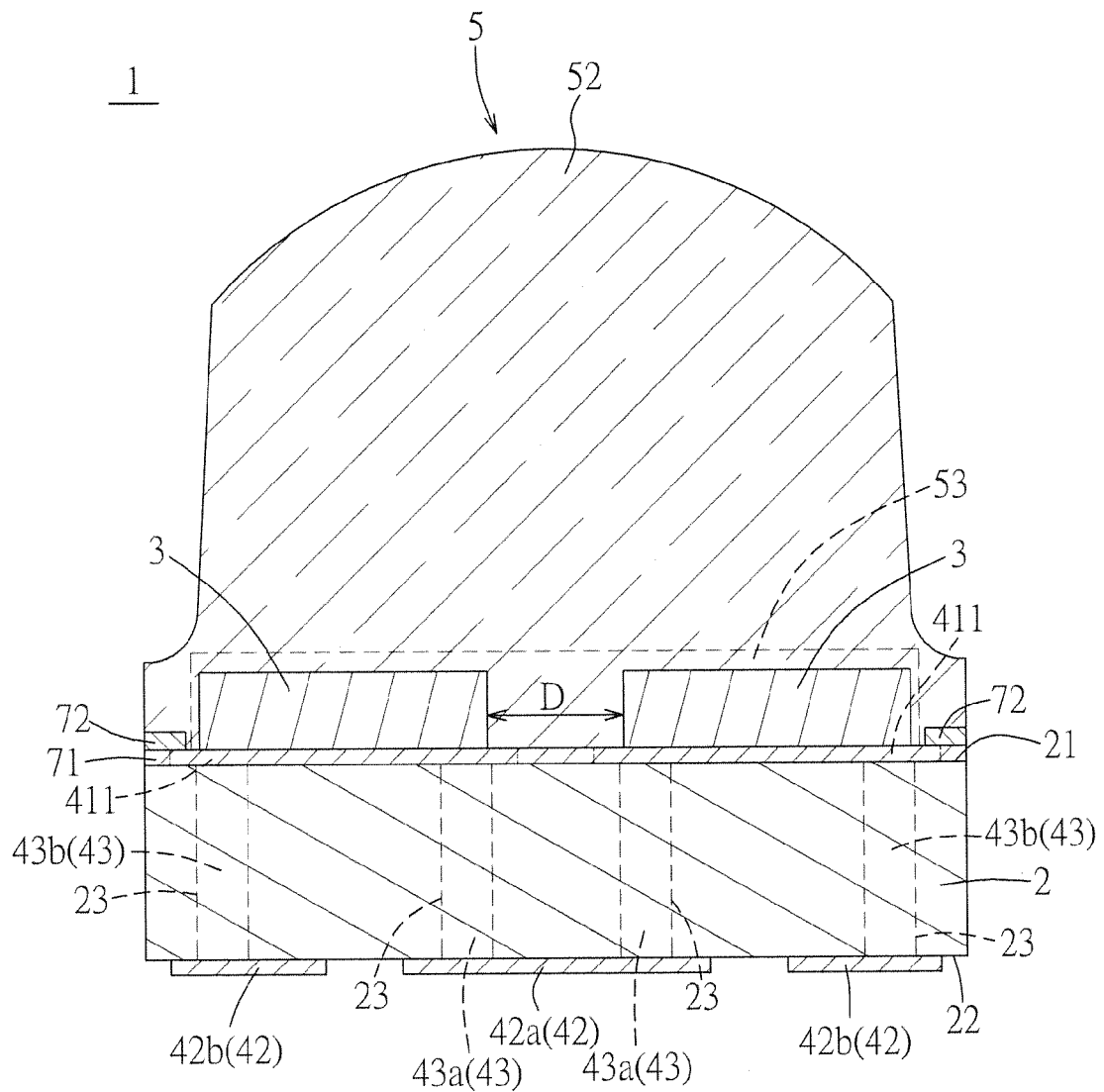
FIG. 3 is a cross-sectional view of the first implementation of the first embodiment taken along line III-III of FIG. 1.

FIGS. 1, 2 and 3 illustrate a first implementation of a first embodiment of an LED device 1 according to the present disclosure. The LED device 1 is packaged by a chip-scale packaging (CSP) technique. Structure and properties such as light extraction efficiency, reliability and view angle of the LED device 1 are described hereinafter with reference to the accompanying drawings.

Generally speaking, the LED device 1 according to the first implementation of the first embodiment includes a substrate 2, two flip-chip LED dies 3, an electrical conductive structure 4, a lens structure 5, an insulation layer 71 and a reflection layer 72, all of which will be described in detail hereinafter.

Substrate 2

Referring to FIGS. 1, 2 and 3, the substrate 2 is a carrier substrate that is configured into a square board, has an upper surface 21 and a lower surface 22 opposite to the upper surface 21, and is formed with a plurality of through holes 23 that are defined between the upper and lower surfaces 21, 22 and that penetrate through the substrate 2. In the first implementation of the first embodiment, the substrate 2 is made of a highly reflective ceramic material for enhancing light brightness and heat dissipation of the LED device 1. However, the material used for making the substrate 2 is not limited to ceramic material and may be chosen based on actual needs.

Figure 4:
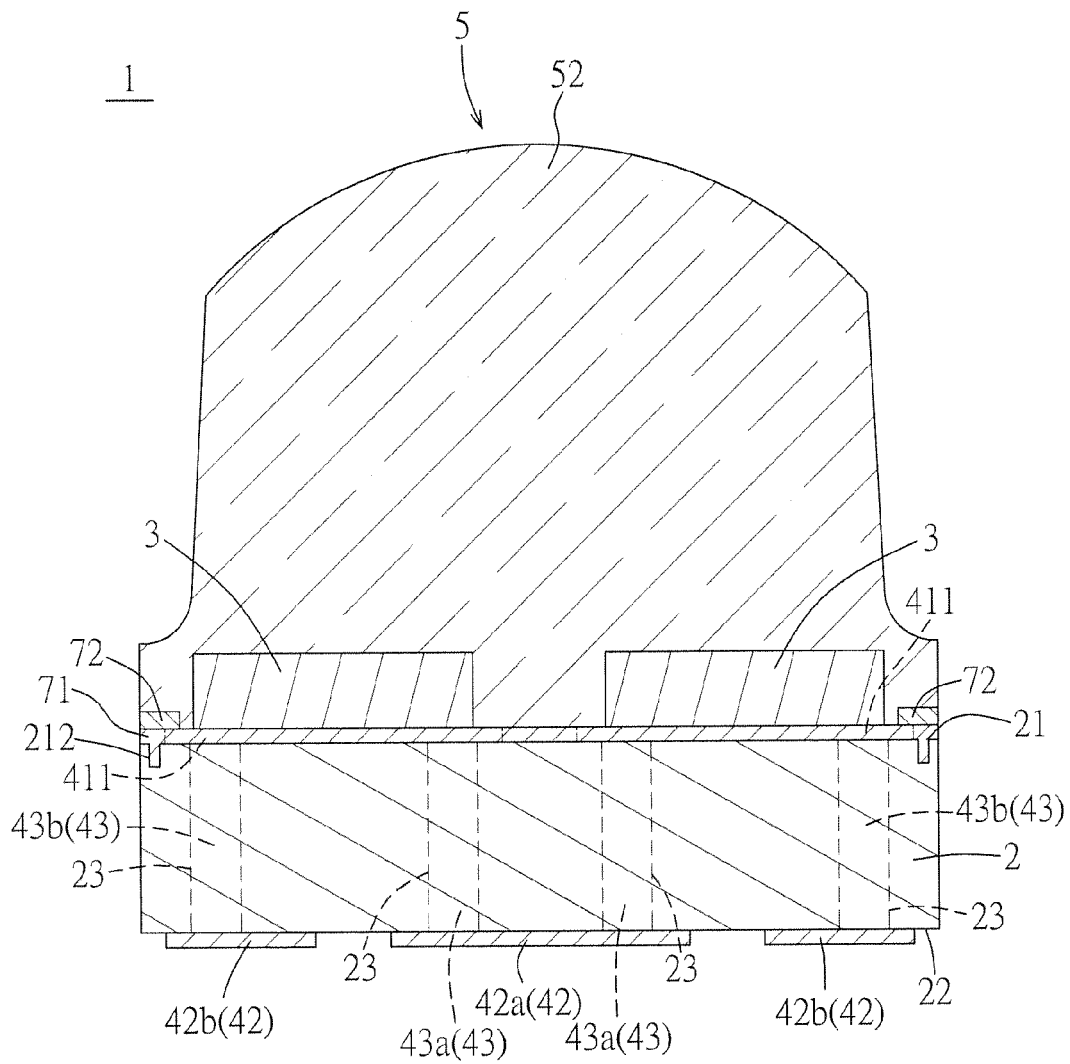
FIG. 4 is a first variation of the first implementation of the first embodiment.

FIG. 4 is a first variation of the first implementation of the first embodiment of the LED device 1. After long-term usage, undesirable substances, such as ambient moisture, chemical compounds, etc., tend to leak into the LED device 1 via a juncture between the substrate 2 and the lens structure 5. This may cause wiring sulfurization of the LED device 1 resulting in degradation of LED light output. The substrate 2 may be formed with a groove 212 recessed from the upper surface 21 and surrounding the flip-chip LED dies 3. In forming the lens structure 5, molten material for the lens structure 5 will flow into the groove 212, followed by solidifying the molten material to form the lens structure 5 and therefore obtaining a protrusion of the lens structure 5 into the groove 212. The protrusion of the lens structure 5 is capable of resisting the abovementioned undesirable substances from entering the LED device 1 to reach the flip-chip LED dies 3. Reliability of the LED device 1 is therefore improved.

Flip-chip LED Dies 3

Referring to FIGS. 1, 2 and 3, the flip-chip LED dies 3 serve as light source of the LED device 1 and are disposed on the upper surface 21 of the substrate 2. Each of the flip-chip LED dies 3 includes a positive electrode 31 and a negative electrode 32 that are spaced apart from each other and that face down to be connected to the electrical conductive structure 4. In the first implementation of the first embodiment, the flip-chip LED dies 3 cooperate with the electrical conductive structure 4 to form a series circuit. The flip-chip LED dies 3 include a first flip-chip LED die 3a and a second flip-chip LED die 3b that have identical electrode configurations to be disposed on the substrate 2. That is to say, the positive electrodes 31 of the first and second flip-chip LED dies 3a, 3b are positioned to be adjacent to each other, and the negative electrodes 32 of the flip-chip LED dies 3a, 3b are positioned to be adjacent to each other. In a conventional LED device, flip-chip LED dies of the conventional LED device are arranged in a manner that a positive electrode of each of the flip-chip LED dies is adjacent to a negative electrode with the other one of the flip-chip LED dies. Therefore, chip rotation is required when mounting the flip-chip LED dies onto a substrate. In contrast, chip rotation is not required for the flip-chip LED dies 3a in this disclosure, 3b. The overall process flow is therefore simplified.

On the other hand, in order to achieve miniaturization of the LED device 1 packaged by a chip-scale packaging (CSP) technique, surface dimensions of the substrate 2 should be as close to overall surface dimensions of the flip-chip LED dies 3 as possible, that is, an area of the upper surface 21 of the substrate 2 is only slightly greater than an overall surface area of the flip-chip LED dies 3. In the first implementation of the first embodiment of the LED device 1, a ratio of the overall surface area of the flip-chip LED dies 3 to the area of the upper surface 21 of the substrate 2 ranges from 22.7% to 76.2% to strike a balance among miniaturization, performance and process yield.

View angle of the flip-chip LED dies 3 would be affected by dimensions thereof. An LED device with a large view angle would have a rather dispersed light emission, while an LED device with a small view angle would have a rather concentrated light emission. Therefore, compared with the LED with small view angle, light emitted by the LED with large view angle tends to be shaded by surrounding components. Table 1 below shows relations between view angles and spacing between the flip-chip LED dies 3. For the view angle ranging from 110 degrees to 150 degrees, the spacing D (see FIG. 3) ranges from 0.19 mm to 0.5 mm. To be more specific, the spacing between adjacent flip-chip LED dies 3 is not less than 0.19 mm to prevent light absorption attributed to adjacent LED dies and therefore improve overall brightness of light emitted by the LED device 1.

TABLE 1

| | View angle (degree) | | | | | | | |
| --- | --- | --- | --- | --- | --- | --- | --- | --- |
| | 150 | 143 | 135 | 130 | 125 | 120 | 115 | 110 |
| Spacing D (mm) | 0.5 | 0.4 | 0.32 | 0.29 | 0.26 | 0.23 | 0.21 | 0.19 |

Electrical Conductive Structure 4

Figure 5:
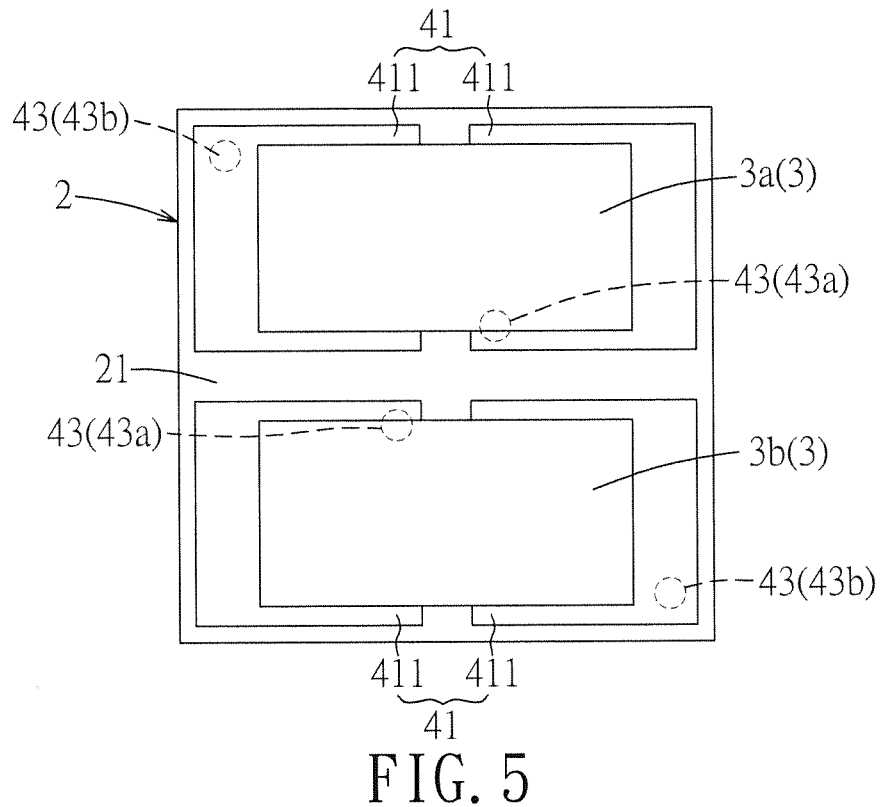
FIG. 5 is a top view of the first implementation of the first embodiment, but without a lens structure.
Figure 6:
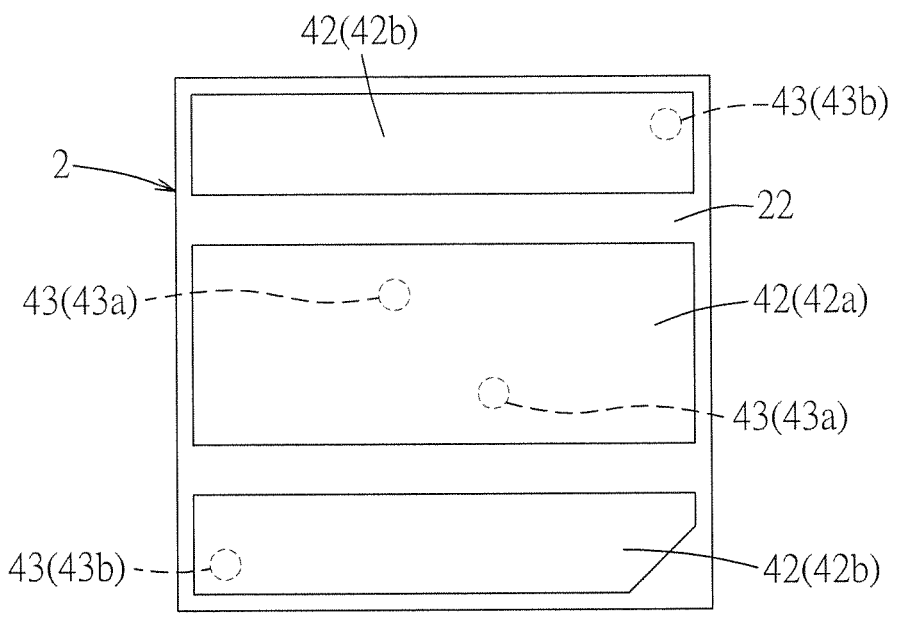
FIG. 6 is a bottom view of the first implementation of the first embodiment.

FIGS. 2, 3, 5 and 6 illustrate the electrical conductive structure 4 of the first implementation of the first embodiment of the LED device 1. The electrical conductive structure 4 is designed for electrical interconnection between the flip-chip LED dies 3, and includes two upper bonding pad assemblies 41, three lower bonding pads 42 and four interconnectors 43. FIG. 5 is a top view showing interconnection relations among the flip-chip LED dies 3, the upper bonding pad assemblies 41 and the interconnectors 43. FIG. 6 is a bottom view showing interconnection relations among the lower bonding pads 42 and the interconnectors 43.

The upper bonding pad assemblies 41 are spaced apart from each other and are disposed on the upper surface 21 of the substrate 2. Each of the upper bonding pad assemblies 41 includes two upper bonding pads 411 so as to permit a corresponding one of the flip-chip LED dies 3 to be disposed thereon. Each of the upper bonding pads 411 is configured into a rectangular layer. The upper bonding pads 411 of the upper bonding pad assemblies 41 are arranged in a 2×2 matrix and the upper bonding pads 411 of each upper bonding pad assembly 41 are respectively and electrically connected to the positive and negative electrodes 31, 32 of the corresponding one of the flip-chip LED dies 3.

The lower bonding pads 42 are spaced apart from one another, are disposed on the lower surface 22 of the substrate 2, and include a first lower bonding pad 42a and two second lower bonding pads 42b. Each of the first lower bonding pad 42a and the two second lower bonding pads 42b is configured into a rectangular layer. In the first implementation of the first embodiment of the LED device 1, the first lower bonding pad 42a and the two second lower bonding pads 42b are arranged in a row and the first lower bonding pad 42a is disposed between the two second lower bonding pads 42b.

Each of the interconnectors 43 is disposed in a corresponding one of the through holes 23 and electrically interconnects corresponding ones of the upper and lower bonding pads 411, 42.

The interconnectors 43 include two first interconnectors 43a and two second interconnectors 43b. Each of the first interconnectors 43a has a top portion that is connected to a corresponding one of the upper bonding pads 411 (i.e., upper right and bottom left ones of the upper bonding pads 411 of FIG. 5). The top portions of the first interconnectors 43a are electrically connected to the negative electrode 32 of the first flip-chip LED die 3a and the positive electrode 31 of the second flip-chip LED die 3b correspondingly (alternatively to the positive electrode 31 of the first flip-chip LED die 3a and the negative electrode 32 of the second flip-chip LED die 3b). Each of the first interconnectors 43a has a bottom portion that is connected to the first lower bonding pad 42a. Therefore, the first and second flip-chip LED dies 3a, 3b are electrically connected in series via the first interconnectors 43a and the first lower bonding pad 42a. On the other hand, each of the second interconnectors 43b has a top portion that is connected to a corresponding one of the upper bonding pads 411 (i.e., upper left and bottom right ones of the upper bonding pads 411 of FIG. 5). Each of the second interconnectors 43b has a bottom portion that is connected to a corresponding one of the second lower bonding pads 42b. To be more specific, the upper left one of the upper bonding pads 411 of FIG. 5 is connected to a lower one of the second lower bonding pads 42b of FIG. 6, and the lower right one of the upper bonding pads 411 of FIG. 5 is connected to an upper one of the second lower bonding pads 42b of FIG. 6. The upper right and lower left ones of the upper bonding pads 411 of FIG. 5 are connected to the first lower bonding pad 42a via the first interconnectors 43a.

By the configuration of the electrical conductive structure 4 as described above, the flip-chip LED dies 3a, 3b are electrically connected in series. Furthermore, by connecting the second lower bonding pads 42b to an external circuit (not shown), luminous state of the flip-chip LED dies 3a, 3b can be controlled. Besides, with the configuration and arrangement of the upper bonding pads 411 and the lower bonding pads 42, area of the substrate 2 could be effectively utilized for die bonding process of the flip-chip LED dies 3a, 3b and for applying solder paste to the lower bonding pads 42.

Figure 7:
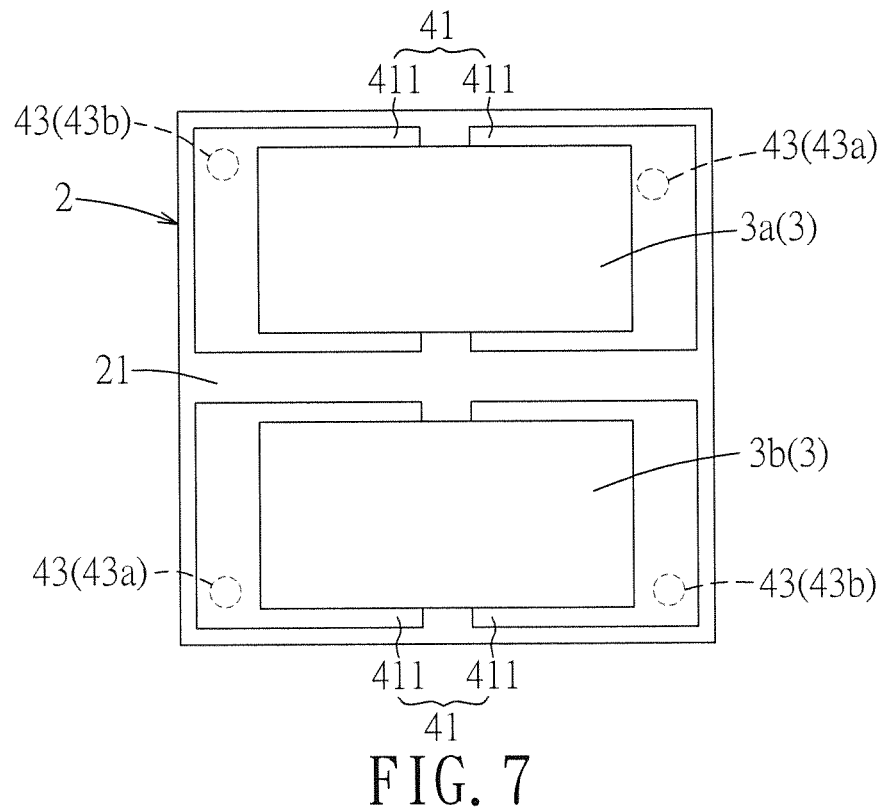
FIG. 7 is a top view of a second implementation of the first embodiment, but without a lens structure.
Figure 8:
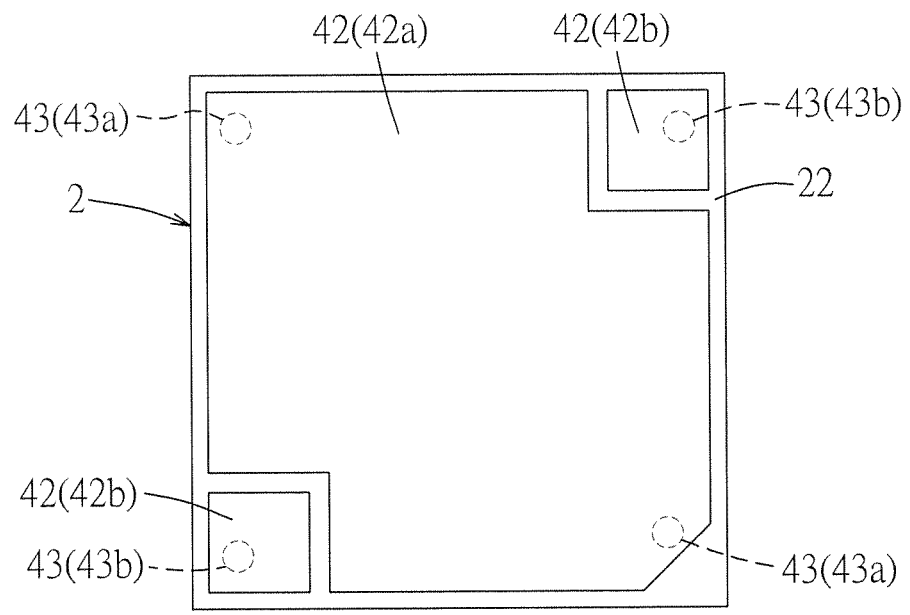
FIG. 8 is a bottom view of the second implementation of the first embodiment.

FIGS. 7 and 8 illustrate a second implementation of the first embodiment of the LED device 1 (see FIG. 1) according to the present disclosure, which includes the same numbers of the upper bonding pads 411, the lower bonding pads 42 and the interconnectors 43 as the numbers of those in the first implementation of the first embodiment of the LED device 1. The differences between the first and second implementations of the first embodiment reside in the configuration and arrangement of the lower bonding pads 42, and the arrangement of the interconnectors 43.

Specifically, in the second implementation of the first embodiment, the first lower bonding pad 42a is configured into a substantially rectangular layer formed with two cutout corners that are arranged diagonally, and is connected to bottom portions of the first interconnectors 43a. Two of the upper bonding pads 411 (i.e., upper right and bottom left ones of the upper bonding pads 411 of FIG. 7) are electrically connected to the first lower bonding pad 42a in series via the first interconnectors 43a, and therefore the first and second flip-chip LED dies 3a, 3b are electrically connected in series. Each of the two second lower bonding pads 42b is configured into a rectangular layer disposed at a corresponding one of the cutout corners of the first lower bonding pad 42a, and is connected to the bottom portion of a corresponding one of the second interconnectors 43b.

That is to say, an upper left one of the upper bonding pads 411 shown in FIG. 7 is electrically connected to a lower left one of the second lower bonding pads 42b shown in FIG. 8 via one of the second interconnectors 43b, and a lower right one of the upper bonding pads 411 shown in FIG. 7 is electrically connected to a upper right one of the second lower bonding pads 42b shown in FIG. 8 via the other one of the second interconnectors 43b. The upper right and lower left ones of the upper bonding pads 411 shown in FIG. 7 are electrically connected to the first lower bonding pad 42a shown at the center part of FIG. 8 via the first interconnectors 43a.

The same effect as that of the first implementation of the first embodiment can be achieved by the second implementation of the first embodiment with the configuration and arrangement of the upper bonding pads 411, the lower bonding pads 42 and the interconnectors 43 as described above.

Figure 9:
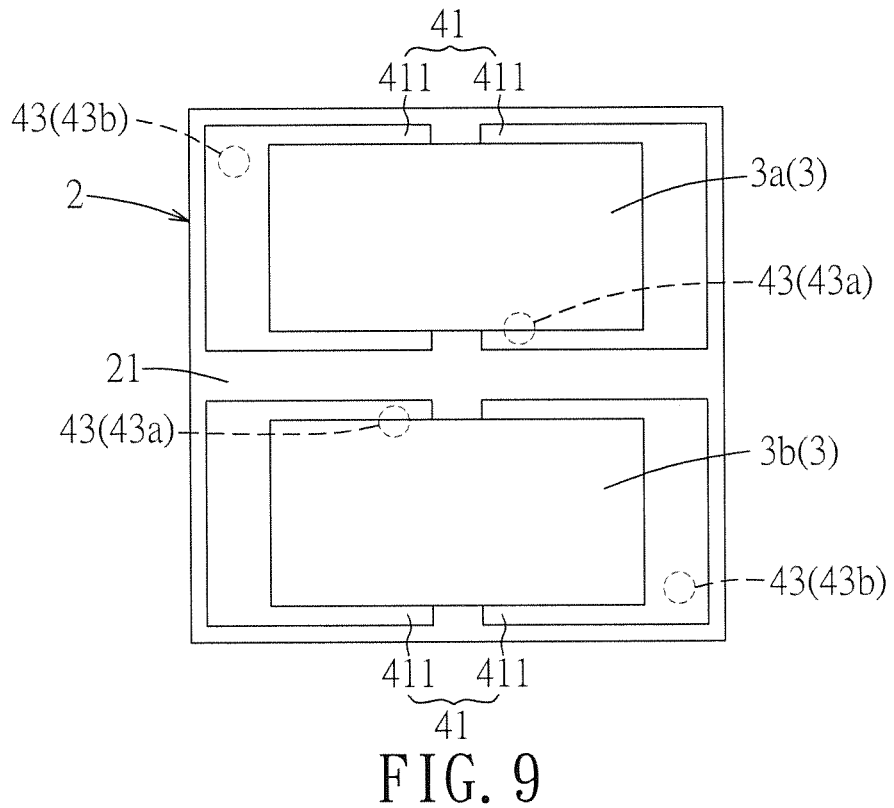
FIG. 9 is a top view of a third implementation of the first embodiment, but without a lens structure.
Figure 10:
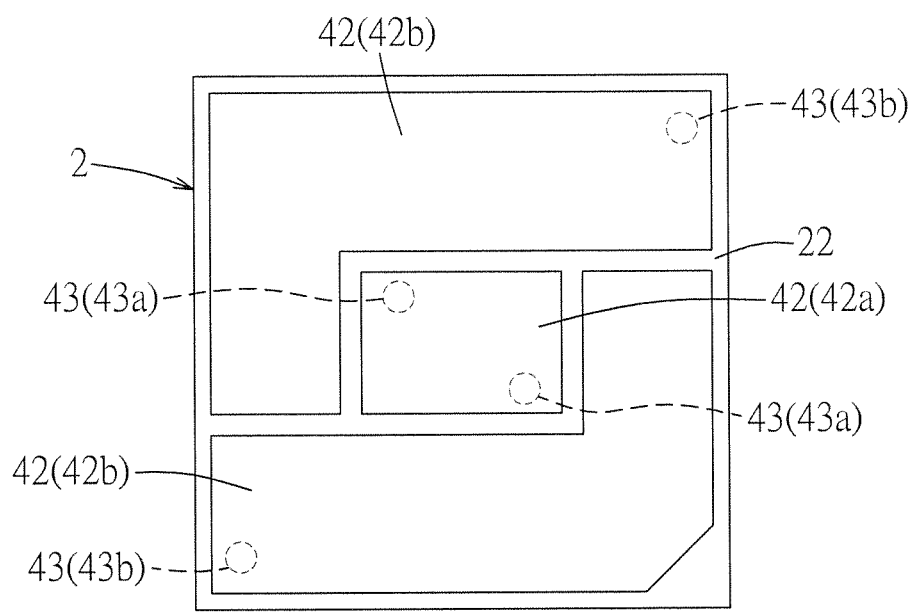
FIG. 10 is a bottom view of the third implementation of the first embodiment.

FIGS. 9 and 10 illustrate a third implementation of the first embodiment of the LED device 1 (see FIG. 1) according to the present disclosure that is similar to the first and second implementations. The differences from the previous implementations also reside in the configuration and arrangement of the lower bonding pads 42, and the arrangement of the interconnectors 43. Specifically, in the third implementation, the first lower bonding pad 42a is configured as a rectangular layer having an area smaller than that of the second lower bonding pad 42b, and is connected to bottom portions of the first interconnectors 43a to achieve electrical connection of the first and second flip-chip LED dies 3a, 3b in series. Each of the two second lower bonding pads 42b has an area larger than that of the first lower bonding pad 42a and is configured as an L-shaped layer. The two second lower bonding pads 42b are correspondingly connected to the bottom portions of the second interconnectors 43b and cooperate with each other to surround the first lower bonding pad 42a. To be more specific, an upper left one of the upper bonding pads 411 shown in FIG. 9 is electrically connected to a lower one of the second lower bonding pads 42b shown in FIG. 10 via one of the second interconnector 43b, and a lower right one of the upper bonding pads 411 shown in FIG. 9 is electrically connected to an upper one of the second lower bonding pads 42b shown in FIG. 10 via the other one of the second interconnectors 43b. Upper right and lower left ones of the upper bonding pads 411 shown in FIG. 9 are electrically connected to the first lower bonding pad 42a via the first interconnectors 43a. Based on the above mentioned, the third implementation of the first embodiment is also capable of achieving the effect as with the first and second implementations of the first embodiment.

Figure 11:
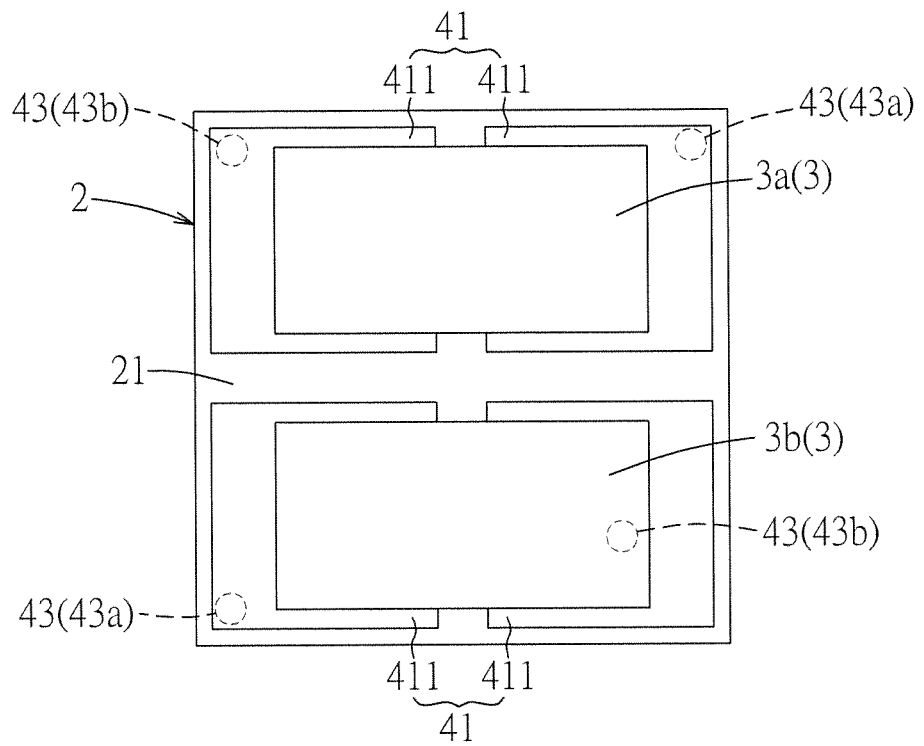
FIG. 11 is a top view of a fourth implementation of the first embodiment, but without a lens structure.
Figure 12:
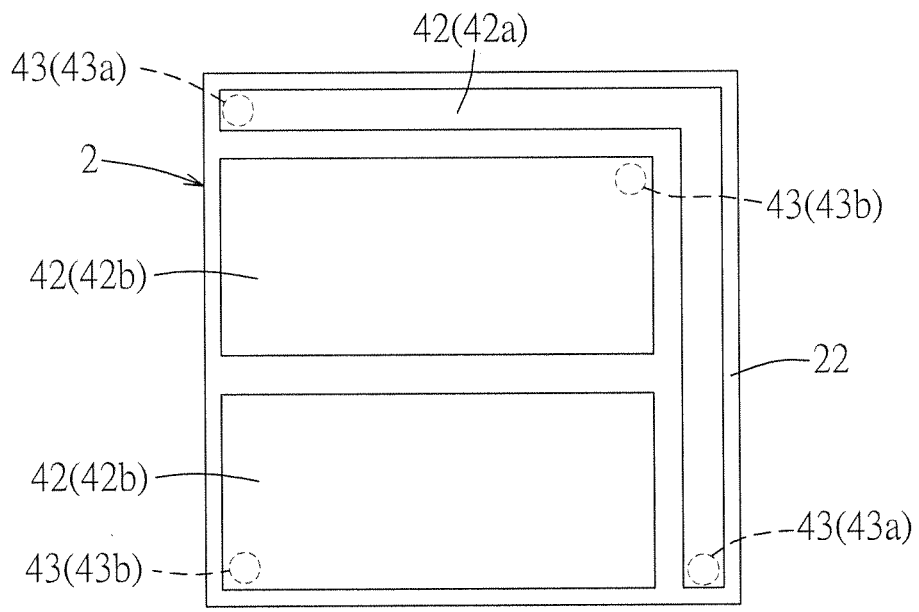
FIG. 12 is a bottom view of the fourth implementation of the first embodiment.
Figure 13:
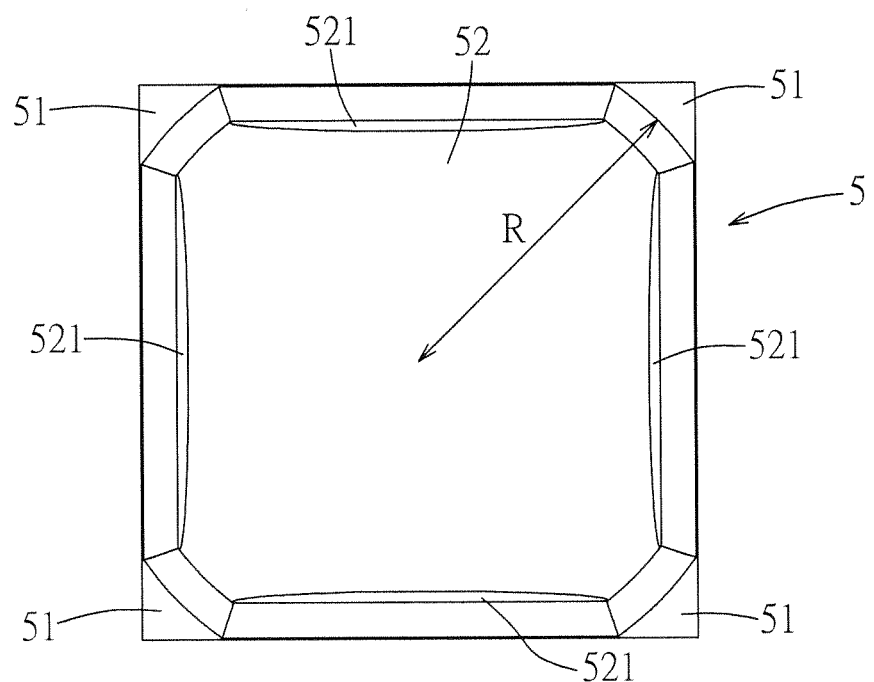
FIG. 13 is a top view of the first implementation of the first embodiment.
Figure 14:
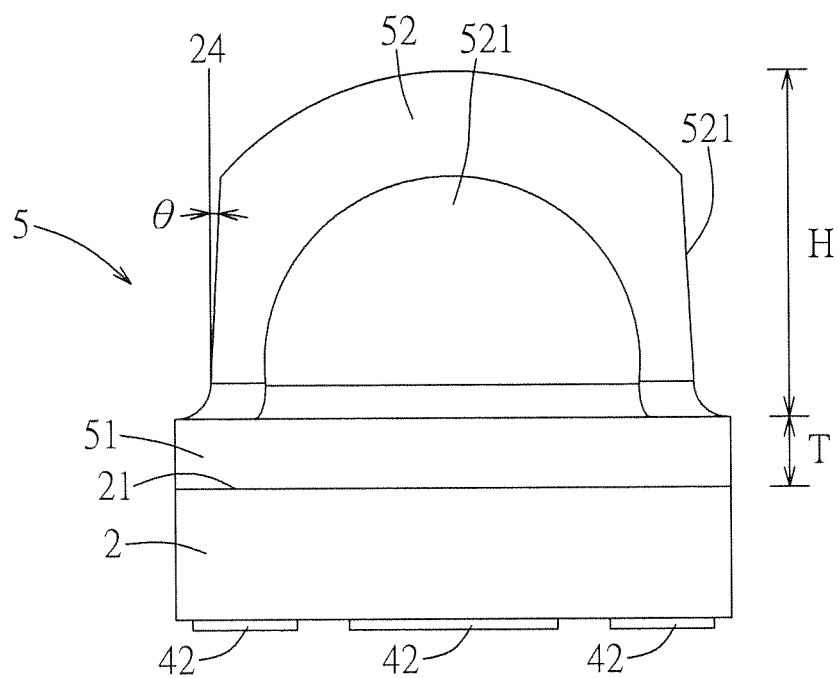
FIG. 14 is a side view of the first implementation of the first embodiment.

FIGS. 11 and 12 illustrate a fourth implementation of the first embodiment of the LED device 1 (see FIG. 1) according to the present disclosure that is similar to the first, second and third implementations. The differences from these other implementations also reside in the configuration and arrangement of the lower bonding pads 42, and the arrangement of the interconnectors 43.

Specifically, in the fourth implementation, the first lower bonding pad 42a is configured into an L-shaped layer with two ends correspondingly connected to the bottom ends of the first interconnectors 43a to achieve electrical connection of the first and second flip-chip LED dies 3a, 3b in series. Each of the two second lower bonding pads 42b is configured as a rectangular layer and is connected the bottom portion of a corresponding one of the second interconnectors 43b. The second lower bonding pads 42b are arranged in a row and partially surrounded by the first lower bonding pad 42a. To be more specific, an upper left one of the upper bonding pads 411 shown in FIG. 11 is electrically connected to a lower one of the second lower bonding pads 42b shown in FIG. 12 via one of the second interconnectors 43b, and a lower right one of the upper bonding pads 411 shown in FIG. 11 is electrically connected to an upper one of the second lower bonding pads 42b shown in FIG. 12 via the other one of the second interconnectors 43b. Upper right and lower left ones of the upper bonding pads 411 shown in FIG. 11 are electrically connected to the L-shaped first lower bonding pad 42a shown in FIG. 12 via the first interconnectors 43b. Based on the above mentioned, the fourth implementation of the first embodiment is also capable of achieving the effect as with the first, second and third implementations of the first embodiment.

Insulation Layer 71

Referring to FIGS. 1, 2 and 3, the insulation layer 71 is disposed on the upper surface 21 of the substrate 2 and is formed with four openings 711, each of which has a shape identical to that of a corresponding one of the upper bonding pads 411. Therefore, the insulation layer 71 is capable of being disposed between the upper bonding pads 411 to be flush with the upper bonding pads 411 for electrical insulation among the upper bonding pads 411. However, the insulation layer 71 may be omitted in other variations of the first implementation of the first embodiment and should not be limited by the description disclosed herein.

Reflection Layer 72

Referring to FIGS. 1, 2 and 3, the reflection layer 72 is provided on at least one of the insulation layer 71 and the upper bonding pads 411 and is formed with at least one opening 722 for receiving the flip-chip LED dies 3. It is worth noting that, in a variation of the first implementation of the first embodiment, the reflection layer 72 may be formed with two openings for respectively receiving the flip-chip LED dies 3. However, the reflection layer 72 may be omitted in other variations of the first implementation of the first embodiment and should not be limited by the description disclosed herein. The reflection layer 72 is capable of alleviating light absorption caused by the substrate 2 or the insulation layer 71, and brightness of light emitted by the LED device 1 is therefore increased.

Lens Structure 5

Referring to FIGS. 1, 2, 3, 13 and 14, the lens structure 5 is a critical optical structure in terms of light emission of the LED device 1, and includes a base member 51 and a lens body 52.

The base member 51 is disposed on the upper surface 21 of the substrate 2 and is configured into a light-transmissible square layer having an area the same as that of the substrate 2.

The lens body 52 is disposed on the base member 51 and is configured in a dome shape with a plurality of side surface cuts 521 to be a first-order optical lens for the light emitted by the flip-chip LED dies 3.

The LED device 1 may further include a phosphor material 53 that is mixed with an encapsulating material to form the lens structure 5. Alternatively, the phosphor material 53 is disposed on the upper surface 21 of the substrate 2, covers the flip-chip LED dies 3, and is surrounded by the base member 51 of the lens structure 5. The phosphor material 53 is capable of being excited by light emitted by the flip-chip LED dies 3 and emits light with a particular wavelength, and thus attributes to adjusting a wavelength of the light emitted by the LED device 1. For example, if the LED device 1 is to be used as a white-light light source, blue-light flip-chip LED dies 3 and yellow phosphor material 53 may be used. Configurations and types of the flip-chip LED dies 3 and the phosphor material 53 may be changed according to practical applications and should not be limited by the description disclosed herein.

In order to elaborate upon the description associated with influence of the dimensions and structure of the lens structure 5 on the optical properties of the LED device 1, the lens body 52 is defined to have a maximum height (H), an orthographic projection of the lens body 52 onto the substrate 2 has a radius (R), an included angle (@) is defined between each of the side surface cuts 521 and an imaginary surface 24 perpendicular to the upper surface 21 of the substrate 2, and the base member 51 of the lens structure 5 has a thickness (T).

Referring to FIGS. 1, 13, 14 and 16, influence of a ratio of the maximum height (H) to the radius (R) of the lens body 52 (hereinafter referred to as H/R ratio) on light extraction efficiency of the LED device 1 will be described in the following.

Figure 16:
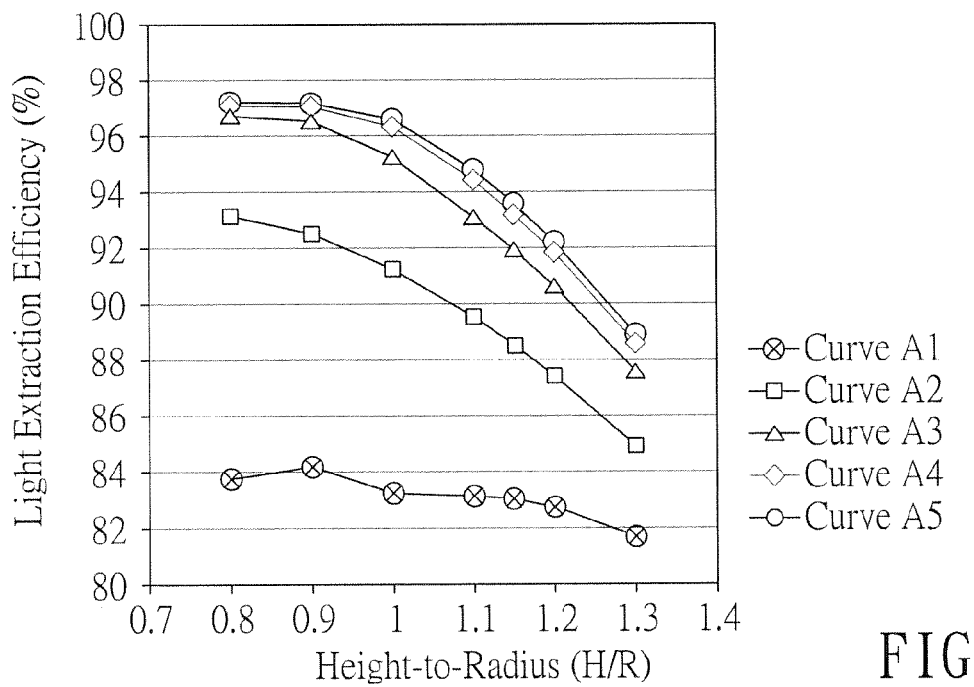
FIG. 16 is a diagram showing relations of light extraction efficiencies of the chip-scale packaged LED devices versus height-to-radius ratios of lens bodies when flip-chip LED dies of various dimensions are used.

In FIG. 16, the horizontal axis denotes the H/R ratio of the lens body 52. A larger H/R ratio corresponds to a larger maximum height (H) when H/R ratio is based on the same value of radius (R). The vertical axis denotes the light extraction efficiency presented in percentage for comparison among data points. Referring further to Table 2 below, curves A1 to A5 in FIG. 16 correspond to LED devices with distinct flip-chip LED die dimensions. Taking curve A2 as an example, the seven points on curve A2 represent LED devices with identical flip-chip LED die dimensions but distinct H/R ratios. For curve A2, the seven LED devices 1 all have the same dimensions of 920 mm×920 mm, but the lens bodies 52 thereof respectively have H/R ratios of 0.8, 0.9, 1, 1.1, 1.15, 1.2 and 1.3.

TABLE 2

| Curve | A1 | A2 | A3 | A4 | A5 |
|---|---|---|---|---|---|
| LED die dimensions (mm × mm) | 1143 × 1125 | 920 × 920 | 644 × 644 | 504 × 504 | 460 × 460 |

As shown by curve A2, for example, a smaller H/R ratio corresponds to a better light extraction efficiency, based on the same flip-chip LED die dimensions. Curves A1, A3, A4 and A5 show substantially the same characteristics. Next, comparison among curves A1-A5 will be described. Based on the same H/R ratios (e.g., the H/R ratios all being 0.9), smaller flip-chip LED die dimensions correspond to better light extraction efficiencies. H/R ratios of 0.8, 1, 1.1, 1.15, 1.2 and 1.3 show substantially the same characteristics.

As demonstrated from the trend shown in FIG. 16, an LED device 1 which includes flip-chip LED dies 3 with smaller dimensions and/or a lens body 52 of smaller H/R ratio has better light extraction efficiency.

Preferably, each of the flip-chip LED dies 3 of the LED device 1 has dimensions from 460 mm×460 mm to 1143 mm×1125 mm and the lens body 52 has an H/R ratio from 0.8 to 1.3. Based on the abovementioned preferable ranges, a user may choose the flip-chip LED dies 3 of suitable dimensions and/or the lens body 52 of suitable H/R ratio for achieving a desired light extraction efficiency.

On the other hand, based on the trend shown in FIG. 16, each of curves A1 to A5 may be substantially represented by a part of a parabola. Generally speaking, a parabola may be represented by a formula of:

$$y=a_n(x-x_n)^2+y_n,$$

in which $y_n$ represents ordinate of vertex of the $n^{th}$ parabola ('n' ranging from 1 to 5). In the first embodiment, $y_1$ to $y_5$ respectively represent optimal light extraction efficiencies of curves A1 to A5. $x_n$ represents abscissa of vertex of the $n^{th}$ parabola. In the first embodiment, $x_1$ to $x_5$ respectively represent H/R ratios that lead to optimal light extraction efficiencies of curves A1 to A5. $a_n$ represents variation of curvature of the $n^{th}$ parabola. In the first embodiment, $a_1$ to $a_5$ respectively represent the variations of the curvature of curves A1 to A5 relative to different H/R ratios. A larger $a_n$ represents a larger variation of light extraction efficiency.

Figure 17:
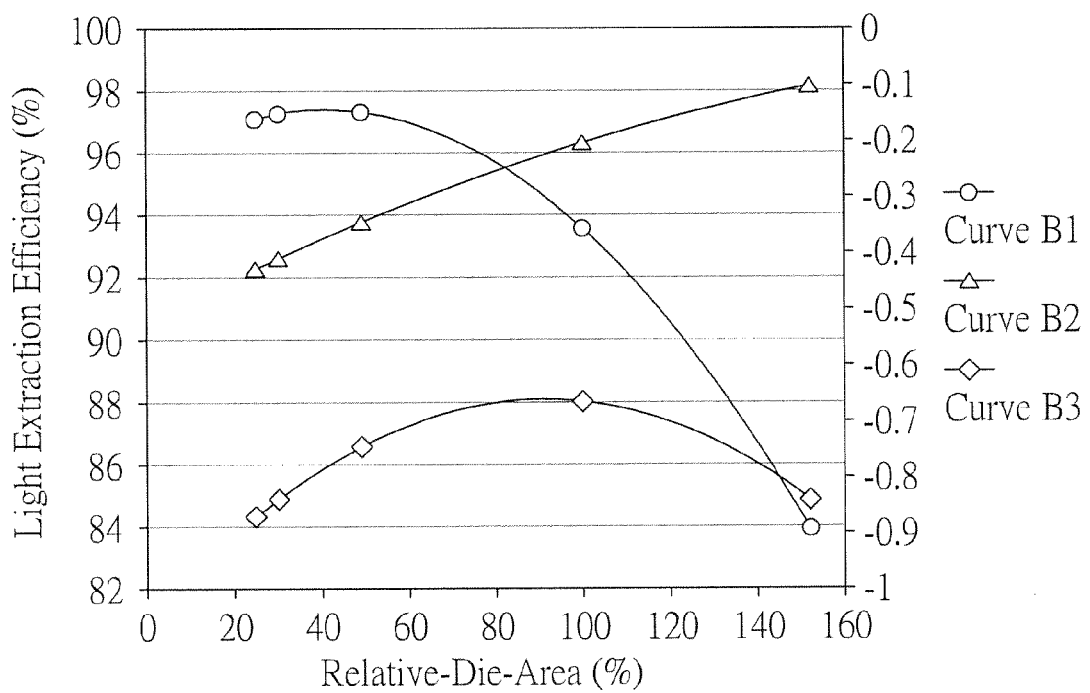
FIG. 17 is a diagram showing the differences of the optical characteristics of the chip-scale packaged LED device when flip-chip LED dies of various dimensions are used.

Referring to FIGS. 16 and 17, the abovementioned trends of $y_n$, $x_n$ and $a_n$ of curves A1 to A5 as shown in FIG. 16 can be further presented in FIG. 17.

In FIG. 17, the horizontal axis denotes relative-die-area percentage based on the flip-chip LED dies 3 having side lengths of 920 mm (i.e., 100%) of curve A2. Therefore, curves A1, A3, A4 and A5 respectively have relative-die-areas percentages of 151.92%, 49%, 30% and 25%. As for the vertical axes, the left vertical axis denotes light extraction efficiency of the LED device 1 and the right vertical axis denotes a corresponding value of $a_n$ and a variation value of $X_n$.

For curve B1, the $y_1$ to $y_5$ values of curves A1 to A5 can be obtained therefrom. For example, the second point from right side of the curve B1 corresponds to an abscissa value of 100% (i.e., the flip-chip LED dies 3 having side lengths of 920 mm) and a left ordinate value $y_n$ (i.e., maximum light extraction efficiency of curve A2 as shown in FIG. 16) can thus be obtained.

For curve B3, the $x_1$ to $x_5$ values of curves A1 to A5 can be obtained therefrom. For example, the second point from right side of curve B3 corresponds to an abscissa value of 100% (i.e., the flip-chip LED dies 3 having side lengths of 920 mm) and a right ordinate value $x_2$ (i.e., change in the H/R ratio of curve A2 as shown in FIG. 16) can thus be obtained, which means that curve A2 has a maximum light extraction efficiency when having a H/R ratio of $x_2$.

For curve B2, the $a_1$ to $a_5$ values of curves A1 to A5 can be obtained therefrom. For example, the second point from right side of curve B2 corresponds to an abscissa value of 100% (i.e., the flip-chip LED dies 3 having side lengths of 920 mm) and a right ordinate value $a_2$ (i.e., curvature change value $a_2$ of curve A2 as shown in FIG. 16) can thus be obtained. Based on the trend of curve B2, an absolute value of the curvature change value $a_2$ is larger for an LED die with smaller dimensions. Therefore, when the LED device 1 includes the flip-chip LED dies 3 of smaller dimensions, change in the H/R ratio of the lens body 52 would result in a larger change in light extraction efficiency.

Accordingly, based on curves B1 to B3 as shown in FIG. 17, the influence of structural design of the LED device 1 on light extraction efficiency can be obtained.

Referring to FIGS. 1, 13, 14 and 18, the influence of the included angles (θ) between the side surface cuts 521 and the imaginary surfaces 24 on the light extraction efficiency of the LED device 1 will be described hereinafter.

Figure 18:
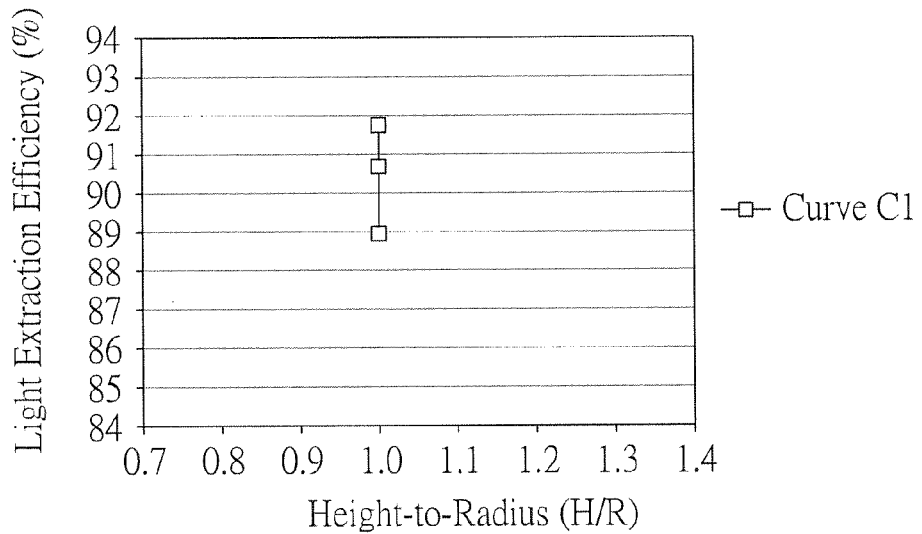
FIG. 18 is a diagram showing relations between included angles associated with side surface cuts of lens body and light extraction efficiency of the chip-scale packaged LED device.

In FIG. 18, the horizontal axis denotes the H/R ratio of the lens body 52, and the vertical axis denotes the light extraction efficiency of the LED device 1. Each of the three points on line C1 represents the LED device 1 including the flip-chip LED dies 3 of 920 mm side lengths, and the lens body 52 having an H/R ratio of 1. The three points on line C1 respectively correspond to included angles (θ) of 1 degree, 5 degrees and 10 degrees, from top to bottom. As can be seen in FIG. 18, the smaller the included angle (θ), the better the light extraction efficiency of the LED device 1. Although preferably the included angle (θ) ranges from 0 degrees to 10 degrees, in which the LED device 1 can have favorable optical properties, the user may choose a desired included angle (θ) based on the abovementioned trends and according to actual needs.

Referring to FIGS. 1, 13, 14 and 19, the influence of the thickness (T) of the base member 51 of the lens structure 5 on the light extraction efficiency and the view angle of the LED device 1 is illustrated.

Figure 19:
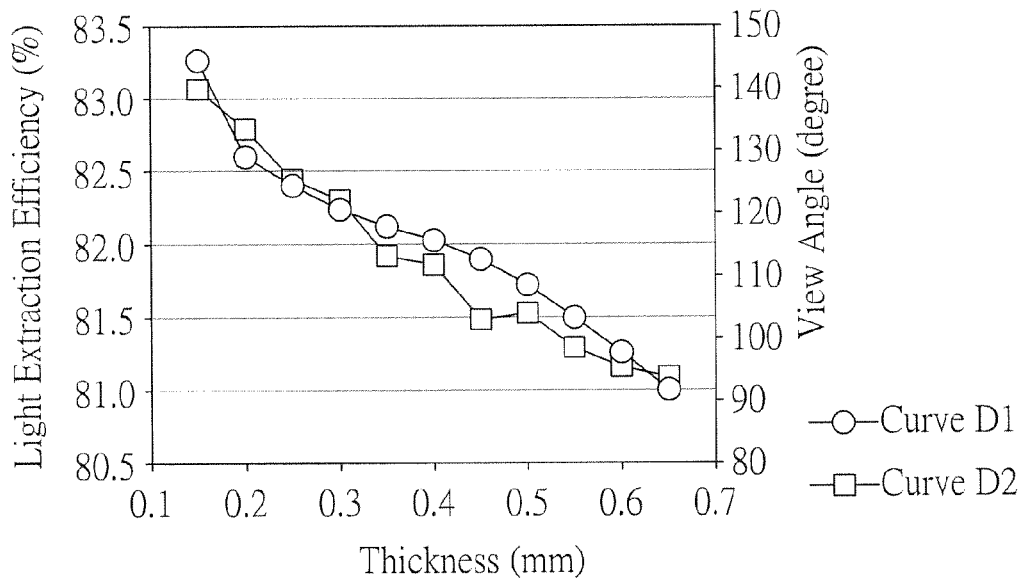
FIG. 19 is a diagram showing relations among thickness of base members and light extraction efficiency and view angles of the chip-scale packaged LED device.

In FIG. 19, the horizontal axis denotes the thickness (T) of the base member 51. The left vertical axis denotes the light extraction efficiency of the LED device 1 and the right vertical axis denotes the view angle of the LED device 1. Each of the points on curves D1 and D2 represents an LED device 1 including flip-chip LED dies 3 of 920 mm side lengths.

Curve D1 shows the influence of the thickness (T) of the base member 51 on the light extraction efficiency of the LED device 1. In the first embodiment, the thickness (T) of the base member 51 preferably ranges from 0.1 mm to 0.7 mm. The smaller the thickness (T) of the base member 51, the better the light extraction efficiency of the LED device 1.

Curve D2 shows the influence of the thickness (T) of the base member 51 on the view angle of the LED device 1. Based on curve D2, the smaller the thickness (T) of the base member 51, the larger the view angle of the LED device 1.

Therefore, based on the trends shown in FIG. 19, the user can choose a suitable thickness (T) of the base member 51 according to the required light extraction efficiency and the view angle of the LED device 1.

Figure 15:
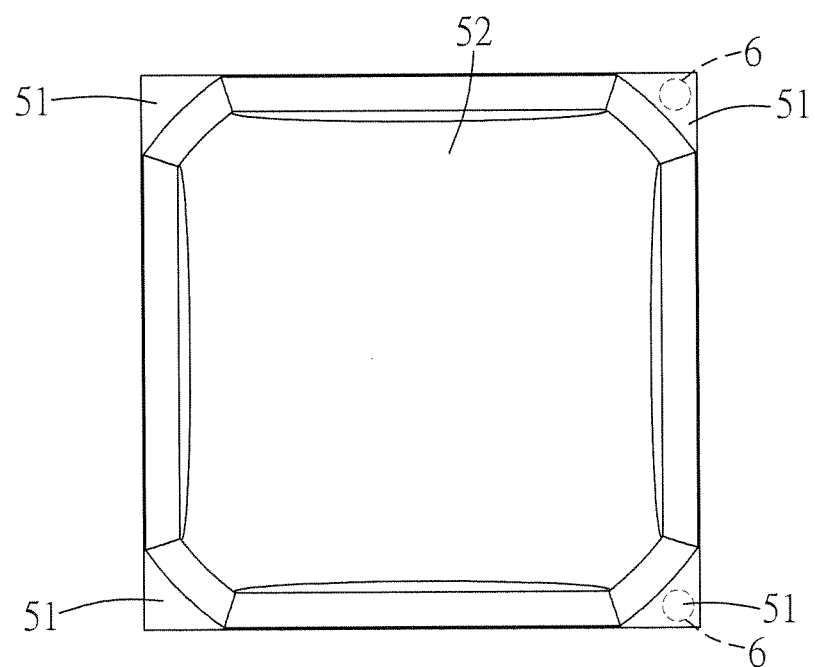
FIG. 15 is a top view of a second variation of the first implementation of the first embodiment.

FIG. 15 shows a second variation of the first implementation of the first embodiment of the LED device 1 (see FIG. 1). The LED device 1 further includes two identification mark components 6 that are disposed on the substrate 2 (see FIG. 1), that are covered by the base member 51, and that respectively correspond in position to regions of the base member 51 not covered by the lens body 52. It is worth noticing that the identification mark components 6 are not covered by the phosphor material 53 (see FIG. 3) and an orthographic projection of the lens body 52 onto the substrate 2 is not interfered by the identification marks components 6. Accordingly, the identification mark components 6 enable identification of positions and directions of internal components of the LED device 1 by the user or manufacturing facilities, without interfering with the lens body 52, and therefore the manufacturing process is expedited. In other variations, the number of the identification mark component(s) 6 may be adjusted to one or more than two, while still being capable of facilitating the manufacturing process (for example, enabling leveling calibration).

Figure 20:
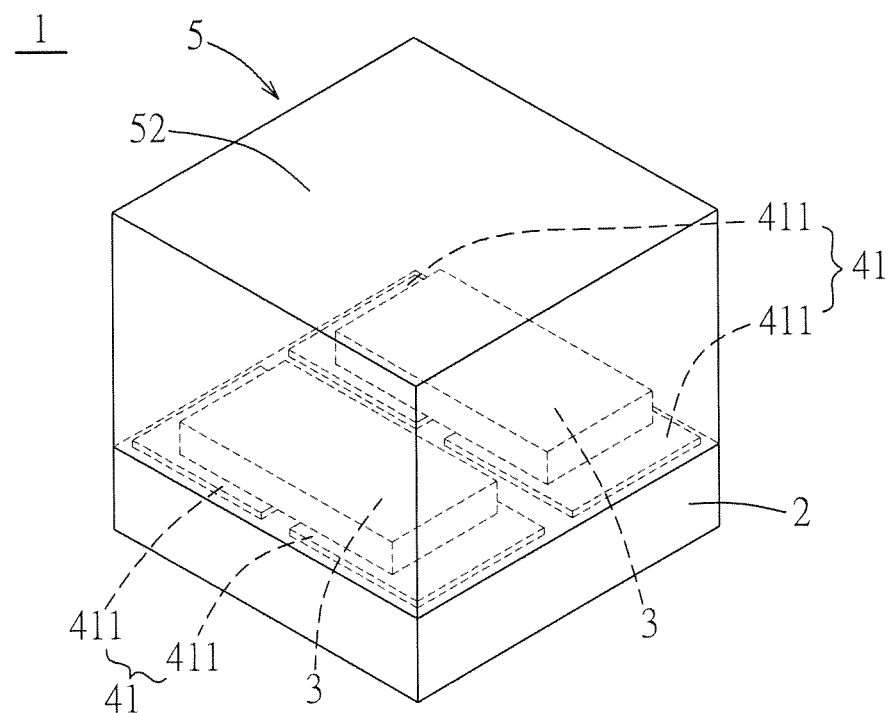
FIG. 20 is a perspective view of a third variation of the first implementation of the first embodiment.

FIG. 20 shows a third variation of the first implementation of the first embodiment of the LED device 1. Besides being configured in a dome shape formed with the side surface cuts 521, the lens body 52 may be configured in a cubic shape having optical properties different from those of the dome shape. The insulation layer 71 and the reflection layer 72 (see FIG. 1) are omitted in the third variation of the first implementation of the first embodiment. However, it should be noted that the use of the insulation layer 71 and the reflection layer 72 may be changed according to actual needs and should not be limited by the disclosure of FIG. 20.

Second Embodiment

Figure 21:
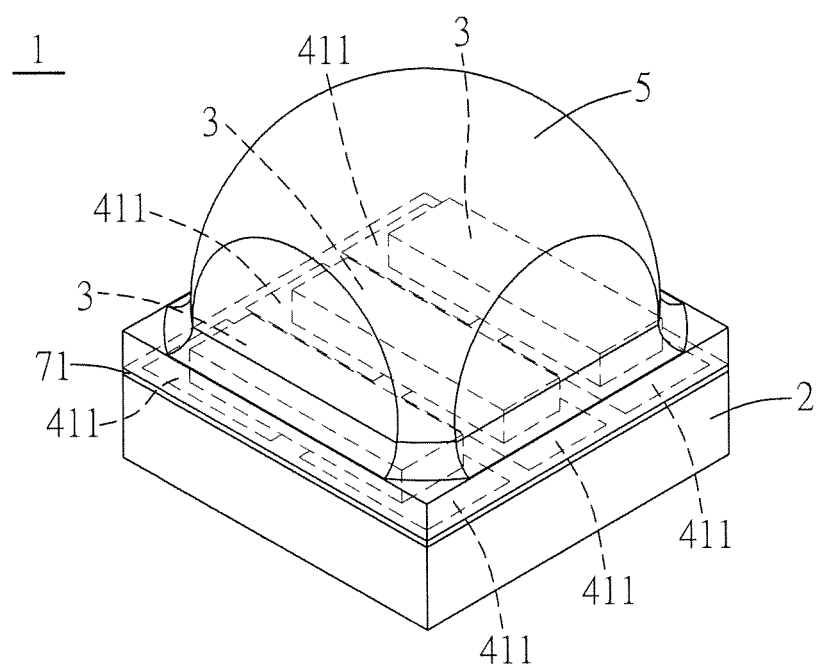
FIG. 21 is a perspective view of a second embodiment of the chip-scale packaged LED device according to the present disclosure.
Figure 22:
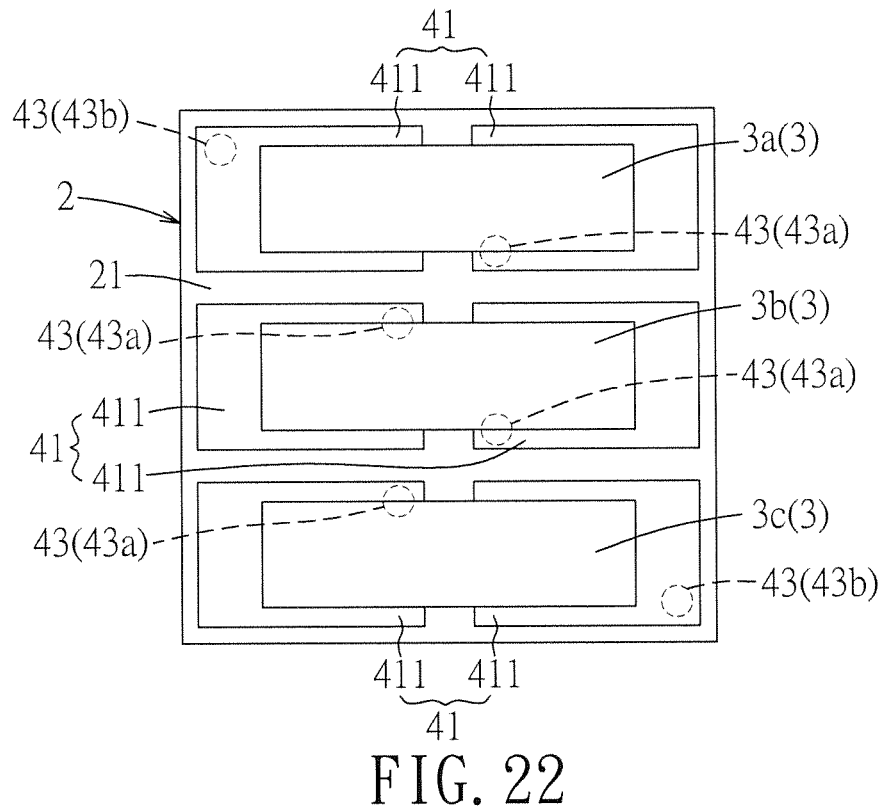
FIG. 22 is a top view of the second embodiment, but without a lens structure.
Figure 23:
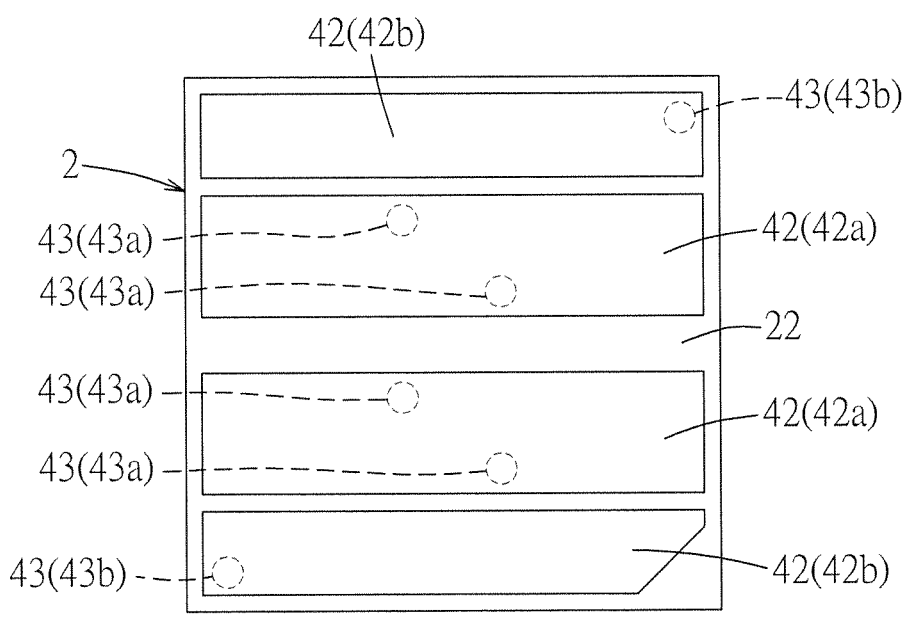
FIG. 23 is a bottom view of the second embodiment.

FIGS. 21 to 23 show a second embodiment of the LED device 1 according to the present disclosure. The second embodiment of the LED device 1 has a structure similar to that of the first embodiment. The differences between these two embodiments reside in the numbers and arrangements of the flip-chip LED dies 3, the upper bonding pads 411, the lower bonding pads 42 and the interconnectors 43.

To be more specific, the relative numbers of the components are based on the number of the flip-chip LED dies 3, which are bounded by the following rules.

When the number of the flip-chip LED dies 3 is N, the number of the upper bonding pad assemblies 41 is N, the number of the upper bonding pads 411 is 2N, the number of the lower bonding pads 42 is N+1, and the number of the interconnectors 43 is 2N.

In the second embodiment, the number of the flip-chip LED dies 3 is three (i.e., including the flip-chip LED dies 3a, 3b, 3c as shown in FIG. 22). Therefore, the number of the upper bonding pad assemblies 41 is three, the number of the upper bonding pads 411 is six, the number of the lower bonding pads 42 is four, and the number of the interconnectors 43 is six.

Different from the first implementation of the first embodiment as shown in FIGS. 5 and 6, in the second embodiment, the lower bonding pads 42 include two first lower bonding pads 42a and two second lower bonding pads 42b. The interconnectors 43 include four first interconnectors 43a and two second interconnectors 43b. Each of the first lower bonding pads 42a is connected to bottom portions of corresponding two of the first interconnectors 43a. As a result, the flip-chip LED dies 3a, 3b, 3c are electrically connected in series. The second lower bonding pads 42b are respectively connected to bottom portions of the second interconnectors 43b so as to serve as two connection points for electrically connecting the flip-chip LED dies 3a, 3b, 3c to external electrical circuits. Specifically, an upper left one of the upper bonding pads 411 of FIG. 22 is electrically connected to a bottom one of the second lower bonding pads 42b of FIG. 23 via one of the second interconnectors 43b. An upper right one of the upper bonding pads 411 of FIG. 22 is electrically connected to a bottom one of the first lower bonding pads 42a of FIG. 23 via one of the first interconnectors 43a. A center left one of the upper bonding pads 411 of FIG. 22 is electrically connected to the bottom one of the first lower bonding pads 42a of FIG. 23 via another one of the first interconnectors 43a. A center right one of the upper bonding pads 411 of FIG. 22 is electrically connected to a top one of the first lower bonding pads 42a of FIG. 23 via yet another one of the first interconnectors 43a. A lower left one of the upper bonding pads 411 of FIG. 22 is electrically connected to the top one of the first lower bonding pads 42a of FIG. 23 via still another one of the first interconnectors 43a. A lower right one of the upper bonding pads 411 of FIG. 22 is electrically connected to a top one of the second lower bonding pads 42b of FIG. 23 via the other one of the second interconnectors 43b.

Therefore, as described above, the numbers of the upper bonding pads 411, the lower bonding pads 42 and the interconnectors 43 can be determined based on the number of the flip-chip LED dies 3. This facilitates structural design of the LED device 1 and enables effective utilization of the substrate 2 of limited area to achieve miniaturization of the LED device 1.

Besides using two or three flip-chip LED dies 3, four flip-chip LED dies 3 may also be implanted in the LED device 1. Arrangements of the electrical conductive structure 4, the lens structure 5, the insulation layer 71 and the reflection layer 72 may be changed based on actual needs and should not be limited by the first implementation of the first embodiment and the second embodiment.

As shown in FIG. 21, the insulation layer 71 of the LED device 1 is formed with six openings that are spaced apart from one another and that respectively have spaces the same as those of the upper bonding pads 411 such that insulation layer 71 is flush with the upper bonding pads 411 for electrical insulation. The relation between the insulation layer 71 and the upper bonding pads 411 is similar to that of the first embodiment and therefore will not be further described for the sake of brevity. However, the insulation layer 71 may be omitted in other embodiments and should not be limited by the description disclosed herein.

Figure 24:
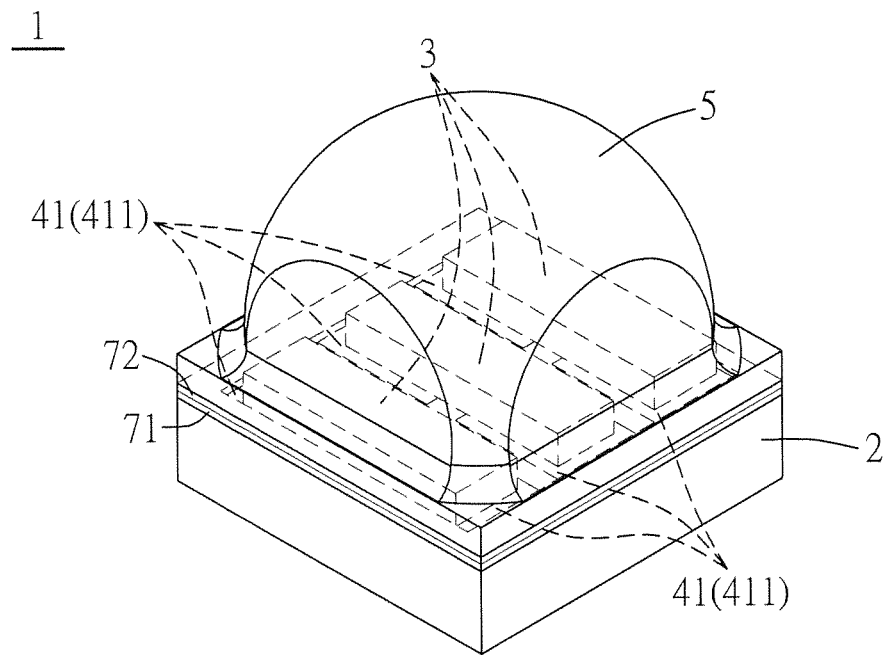
FIG. 24 is a perspective view of a variation of the second embodiment.

As shown in FIG. 24, the reflection layer 72 is provided on at least one of the insulation layer 71 and the upper bonding pads 411 and is formed with at least one opening for receiving the three flip-chip LED dies 3. It is worth noting that the reflection layer 72 may be formed with three openings for respectively receiving the three flip-chip LED dies 3. However, the reflection layer 72 may be omitted in other embodiments and should not be limited by the description disclosed herein. The reflection layer 72 is capable of alleviating light absorption caused by the substrate 2 or the insulation layer 71, and brightness of the light emitted by the LED device 1 is therefore increased.

Third Embodiment

Figure 25:
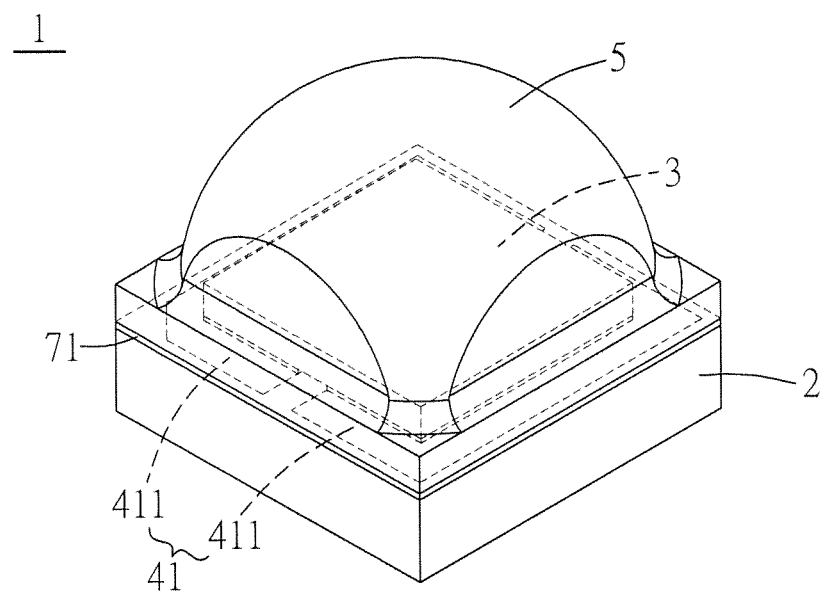
FIG. 25 is a perspective view of a third embodiment of the chip-scale packaged LED device according to the present disclosure.
Figure 26:
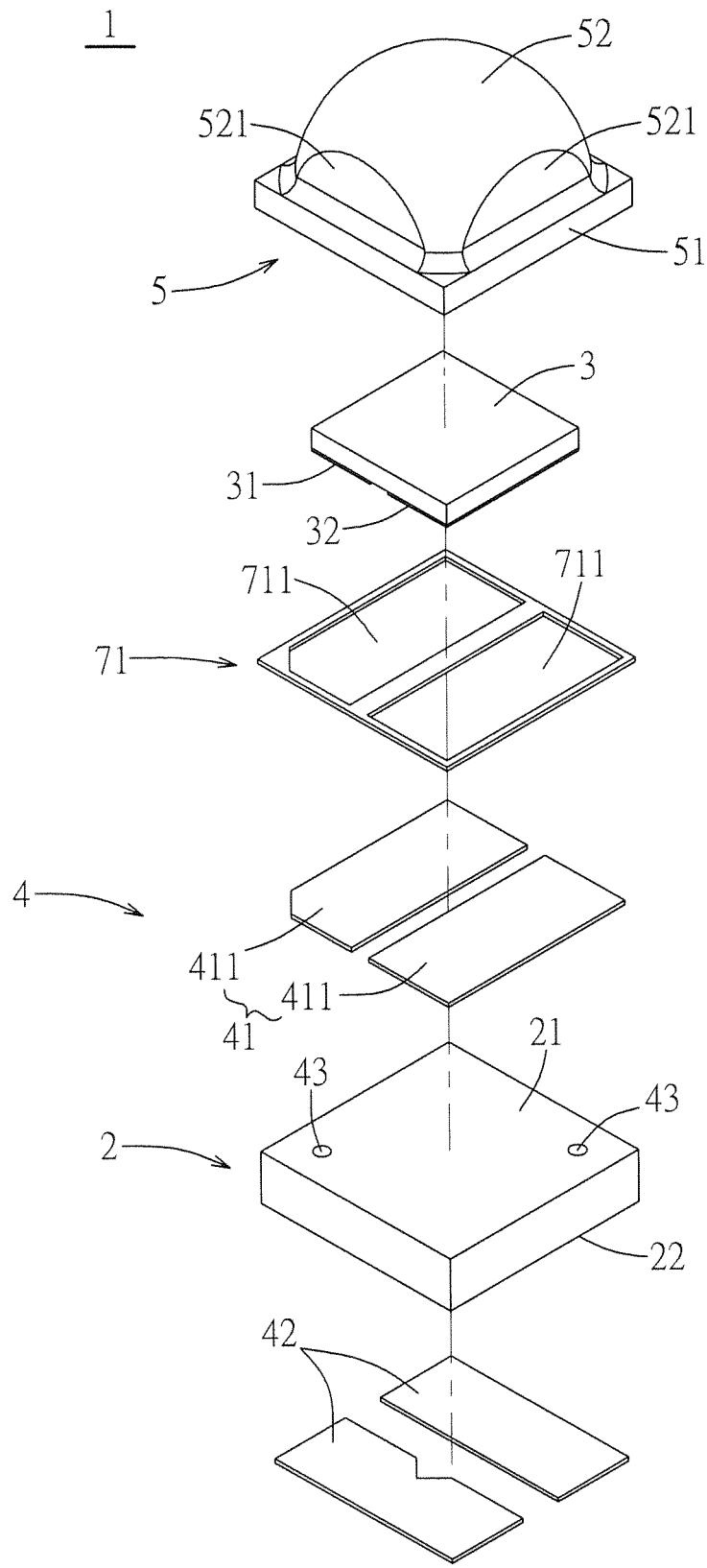
FIG. 26 is an exploded perspective view of the third embodiment.

FIGS. 25 and 26 show a third embodiment of the LED device 1 according to the present disclosure. The third embodiment of the LED device 1 includes a substrate 2, a flip-chip LED die 3, an electrical conductive structure 4, a lens structure 5 and an insulation layer 71.

The third embodiment of the LED device 1 has a structure similar to that of the first embodiment. The differences between the first and third embodiments reside in a number of the flip-chip LED die(s) 3 and the structure of the conductive structure 4.

The first embodiment of the LED device 1 includes a plurality of the flip-chip LED dies 3. However, in the third embodiment, the LED device 1 includes only one flip-chip LED die 3. For example, in a first implementation of the third embodiment, the substrate 2 has dimensions of 1600 mm×1600 mm and the flip-chip LED die 3 has dimensions of 533 mm×1092 mm. A ratio of the surface area of the flip-chip LED die 3 to that of the substrate 2 is 22.7%. In a second implementation of the third embodiment, the substrate 2 has dimensions of 1600 mm×1600 mm and the flip-chip LED die 3 has dimensions of 1397 mm×1397 mm. A ratio of the surface area of the flip-chip LED die 3 to that of the substrate 2 is 76.2%. Under the same dimensions of the substrate 2, the flip-chip LED die 3 may have dimensions between 533 mm×1092 mm and 1600 mm×1600 mm. Therefore, the ratio of the surface area of the flip-chip LED die 3 to that of the substrate 2 ranges from 22.7% to 76.2%. However, dimensions of the flip-chip LED die 3 and the substrate 2, and relative area between the flip-chip LED die 3 and the substrate 2 may be changed and should not be limited by the implementations disclosed above.

The conductive structure 4 has a structure similar to that of the first implementation of the first embodiment, with the differences residing in that, in the third embodiment, the conductive structure 4 includes two lower bonding pads 42. The lower bonding pads 42 are respectively connected to the upper bonding pads 411 via two interconnectors 43. One of the upper bonding pads 411 and one of the lower bonding pads 42 are each formed with a notch. The upper surface 21 and the lower surface 22 of the substrate 2 are each formed with an identification mark (not shown) that enables identification of positions and directions of internal components of the LED device 1 by the user or manufacturing facilities.

The insulation layer 71 is formed with two openings 711, each of which has a shape and an area corresponding to those of a respective one of the upper bonding pads 411 such that the respective upper bonding pad 411 is capable of being disposed in the opening 711. That is, the upper bonding pads 411 define a first pattern and the insulation layer 71 defines a second pattern that is complementary to the first pattern, such that the upper bonding pads 411 are flush with the insulation layer 71. When the positive electrode 31 and the negative electrode 32 of the flip-chip LED die 3 are respectively connected to the upper bonding pads 411, the insulation layer 71 is capable of effectively preventing short circuits from happening. Reliability of the LED device 1 is therefore improved.

Figure 27:
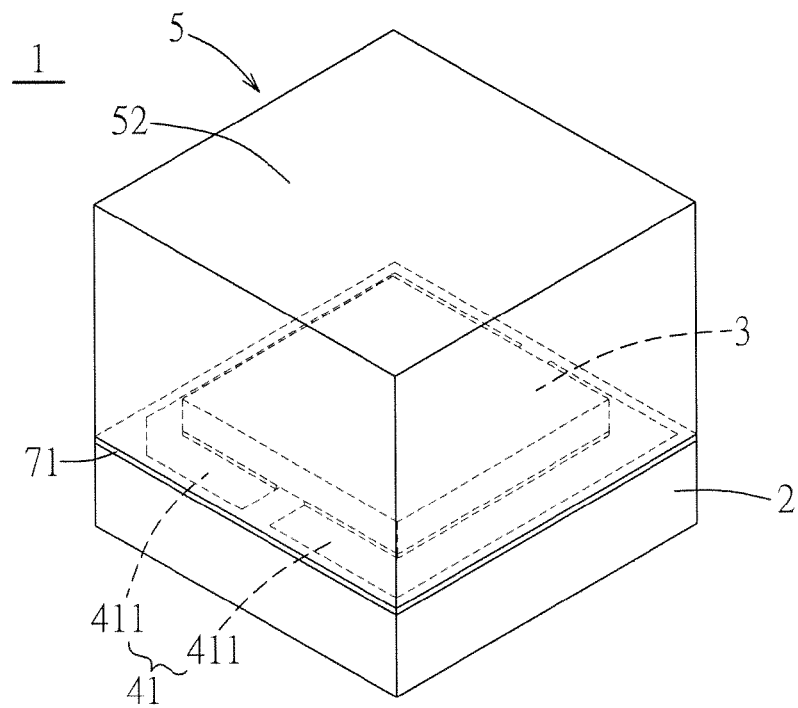
FIG. 27 is a perspective view of a variation of the third embodiment.

FIG. 27 shows a variation of the third embodiment of the LED device 1. Besides being configured in a dome shape formed with the side surface cuts 521 as shown in FIGS. 25 and 26, the lens body 52 may be configured in a cubic shape as shown in FIG. 27. It should be noted that the configuration of the lens body 52 should not be limited to the abovementioned disclosure.

Fourth Embodiment

Figure 28:
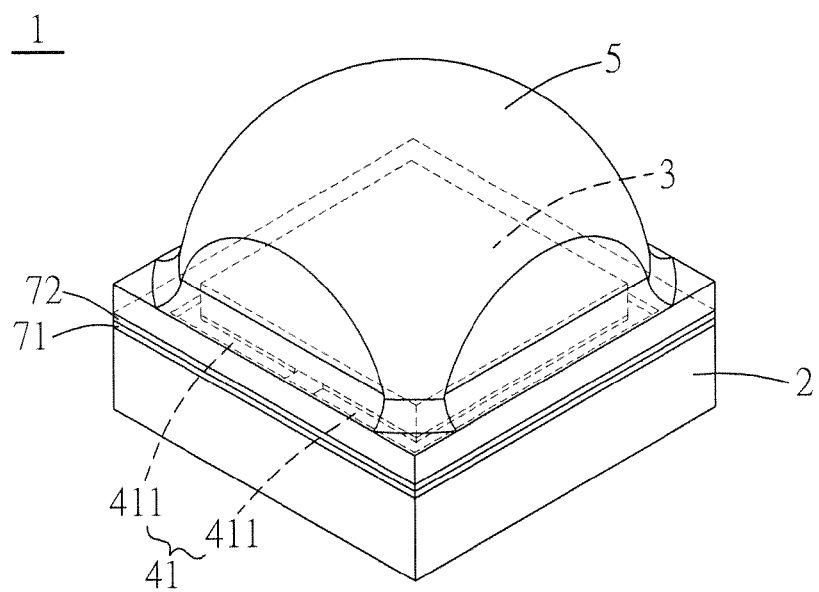
FIG. 28 is a perspective view of a fourth embodiment of the chip-scale packaged LED device according to the present disclosure.
Figure 29:
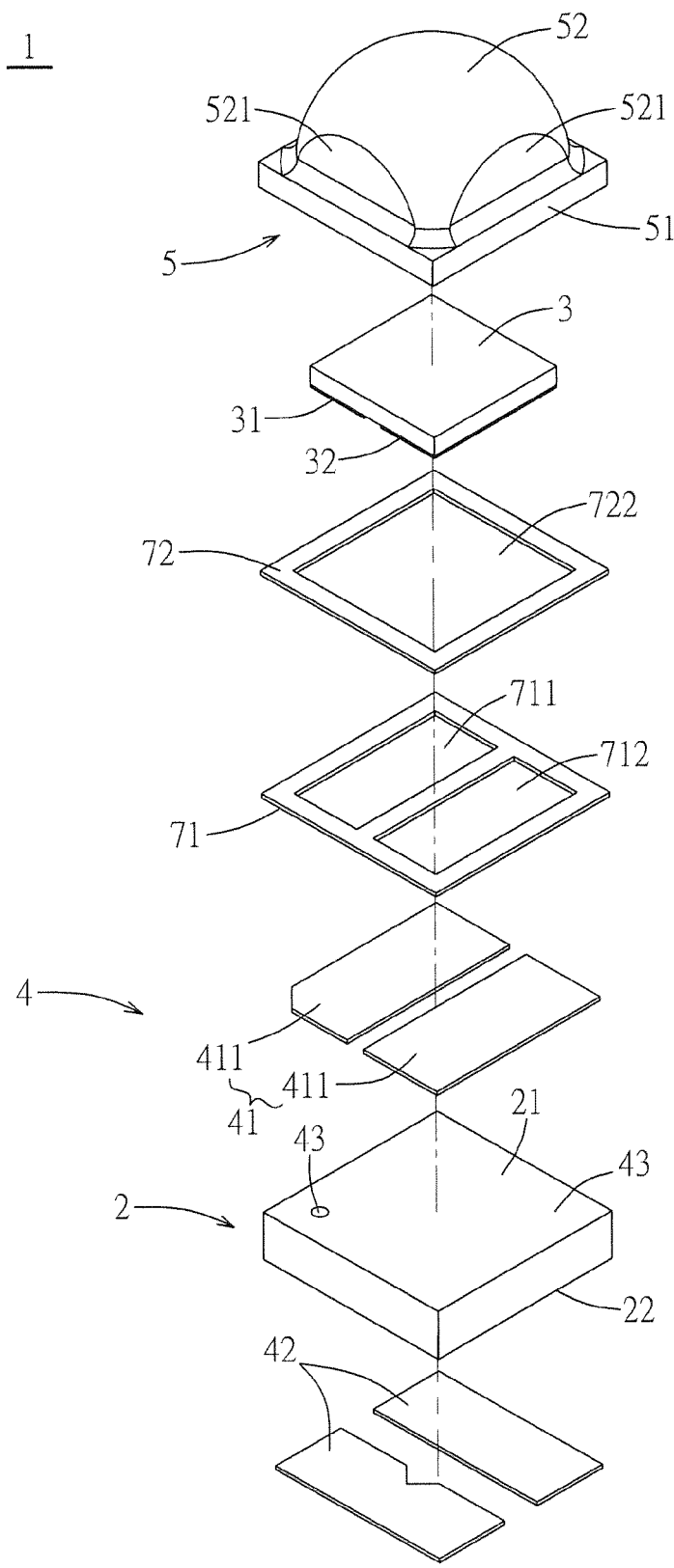
FIG. 29 is an exploded perspective view of the fourth embodiment.

FIGS. 28 and 29 show a fourth embodiment of the LED device 1 according to the present disclosure. The fourth embodiment of the LED device 1 includes a substrate 2, a flip-chip LED die 3, an electrical conductive structure 4, a lens structure 5, an insulation layer 71 and a reflection layer 72.

The fourth embodiment of the LED device 1 has a structure similar to that of the third embodiment with the differences residing in that the fourth embodiment of the LED device 1 further includes the reflection layer 72. The reflection layer 72 may be configured in a square shape and is formed with an opening for receiving the flip-chip LED die 3. In other words, the reflection layer 72 is disposed on the insulation layer 71 and surrounds the flip-chip LED die 3. The reflection layer 72 is made of an insulation material, such as ceramic ink, that has high reflectivity. When the reflection layer 72 and the insulation layer 71 are made of the same material, the reflection layer 72 and the insulation layer 71 may be simultaneously formed on the substrate 2. By providing the reflection layer 72 on the substrate 2 and the insulation layer 71, light absorption attributed to the substrate 2 and the insulation layer 71 can be alleviated and overall brightness of the light emitted by the LED device 1 is therefore improved.

Figure 30:
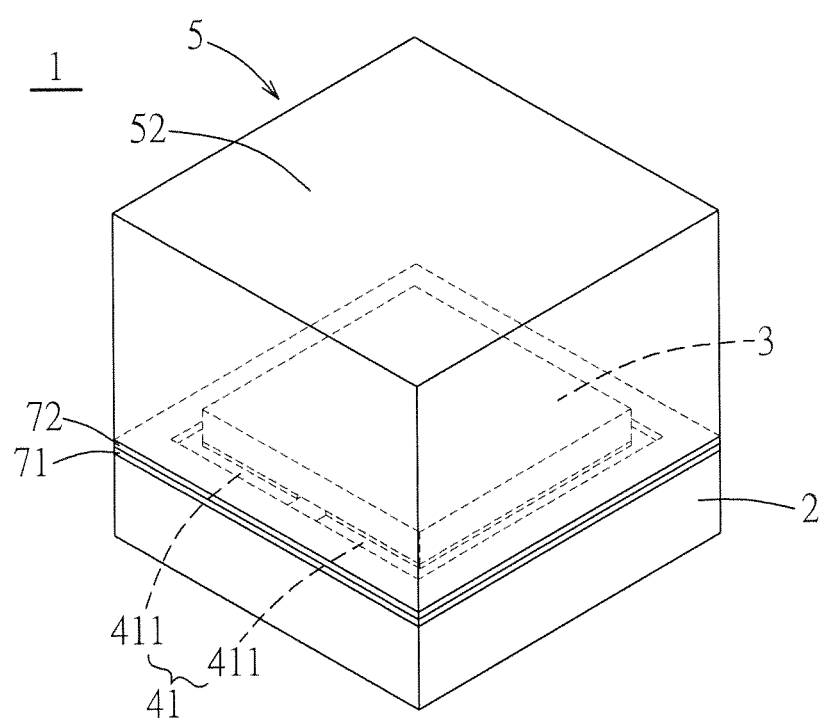
FIG. 30 is a perspective view of a variation of the fourth embodiment.

Referring to FIG. 30, besides being configured in a dome shape formed with the side surface cuts 521 as shown in FIGS. 28 and 29, the lens body 52 may be configured in a cubic shape as shown in FIG. 30. It should be noted that the configuration of the lens body 52 should not be limited to the abovementioned disclosure.

Moreover, the various identification mark components 6 (see FIG. 15) as described above may be used in the fourth embodiment of the LED device 1.

Based on the disclosure above, with the provision of the substrate 2, at least one flip-chip LED die 3, the electrical conductive structure 4, the lens structure 5, the insulation layer 71 and the reflection layer 72, the LED device 1 of the present disclosure can achieve the following effects:

(1) by choosing the material used for making the substrate 2, light brightness and heat dissipation of the LED device 1 can be improved;

(2) by forming the groove 212 in the upper surface 21 of the substrate 2, ambient moisture can be prevented from reaching the at least one flip-chip LED die 3 and reliability of the LED device 1 is therefore improved;

(3) by matching the overall surface dimensions of the at least one flip-chip LED die 3 to dimensions of the upper surface 21 of the substrate 2, miniaturization of the LED device 1 can be realized;

(4) by providing the at least one flip-chip LED die 3 having electrodes 31, 32 configured in the same direction, manufacturing process of the LED device 1 can be simplified;

(5) by limiting the spacing between adjacent two flip-chip LED dies 3, brightness of the light emitted by the LED device 1 can be assured;

(6) by appropriate selection of the numbers of the flip-chip LED die(s) 3, the upper bonding pads 411 of the upper bonding pad assembly (assemblies) 41, the lower bonding pads 42 and the interconnectors 43, the flip-chip LED dies 3 can be electrically connected in series under a limited area of the substrate 2, which facilitates miniaturization of the LED device 1;

(7) with the shapes, arrangements and connections of the upper bonding pads 411, the lower bonding pads 42 and the interconnectors 43 so defined as taught in this disclosure, miniaturization of the LED device 1 can be achieved and the process yield is improved;

(8) with the combination of appropriate size of the flip-chip LED die(s) 3, thickness (T) of the base member 51 of the lens structure 5, H/R ratio of the lens body 52 and included angles (θ) of the side surface cuts 521, the LED device 1 can have superior light extraction efficiency and suitable view angle;

(9) by providing the identification mark components 6, manufacturing process of the LED device 1 can be facilitated;

(10) by providing the insulation layer 71, short circuits among upper bonding pad assembly (assemblies) 41 can be prevented and reliability of the LED device 1 can be improved; and

(11) by providing the reflection layer 72, brightness of the light emitted by the LED device 1 is improved.

Therefore, based on the above disclosure, the LED device 1 can certainly achieve the object of the present disclosure. However, it should be particularly pointed out that the LED device 1 may not include all of the features disclosed in the first to fourth embodiments and may be changed according to practical needs.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A chip-scale packaged LED device, comprising:
a substrate having an upper surface and a lower surface opposite to said upper surface, and being formed with a plurality of through holes that are defined between said upper and lower surfaces and that penetrate through said substrate;
a number (N) of flip-chip LED die(s) disposed on said upper surface of said substrate, each of said flip-chip LED die(s) including a positive electrode and a negative electrode, a ratio of an overall surface area of (N) number of said flip-chip LED die(s) to an area of said upper surface of said substrate ranging from 22.7% to 76.2%;

an electrical conductive structure including a number (N) of upper bonding pad assembly (assemblies), each of which includes two upper bonding pads that are spaced apart from each other, said upper bonding pad assembly (assemblies) being disposed on said upper surface of said substrate so as to permit said flip-chip LED die(s) to be correspondingly disposed on said upper bonding pad assembly (assemblies), said two upper bonding pads of each of said upper bonding pad assembly (assemblies) being correspondingly and electrically connected to said positive and negative electrodes of a corresponding one of said flip-chip LED die(s), a number (N+1) of lower bonding pads spaced apart from one another and disposed on said lower surface of said substrate, and a number (2N) of interconnectors, each of which is disposed in a corresponding one of said through holes and interconnects corresponding ones of said upper and lower bonding pads; and a lens structure disposed on said upper surface of said substrate and covering said flip-chip LED die(s).

2. The chip-scale packaged LED device according to claim 1, wherein the number of said flip-chip LED dies is two, the number of said upper bonding pads is four, the number of said interconnectors is four, and the number of said lower bonding pads is three, said flip-chip LED dies including a first flip-chip LED die and a second flip-chip LED die, said interconnectors including two first interconnectors and two second interconnectors, said lower bonding pads including a first lower bonding pad and two second lower bonding pads, each of said first and second interconnectors having a top portion that is connected to a corresponding one of said upper bonding pads, said top portions of said two first interconnectors being electrically and respectively connected to said positive electrode of said first flip-chip LED die and said negative electrode of said second flip-chip LED die, each of said two first interconnectors having a bottom portion that is connected to said first lower bonding pad, each of said two second interconnectors having a bottom portion that is connected to a corresponding one of said two second lower bonding pads.

3. The chip-scale packaged LED device according to claim 2, wherein said substrate is configured into a square board, each of said upper bonding pads being configured into a rectangular layer, said upper bonding pads being arranged in a matrix, each of said first lower bonding pad and said two second lower bonding pads being configured into a rectangular layer, said first lower bonding pad and said two second lower bonding pads being arranged in a row.

4. The chip-scale packaged LED device according to claim 2, wherein said substrate is configured into a square board, each of said upper bonding pads being configured into a rectangular layer, said upper bonding pads being arranged in a matrix, said first lower bonding pad being configured into a substantially rectangular layer formed with two cutout corners that are arranged diagonally, each of said two second lower bonding pads being configured into a rectangular layer disposed in a corresponding one of said cutout corners of said first lower bonding pad.

5. The chip-scale packaged LED device according to claim 2, wherein said substrate is configured into a square board, each of said upper bonding pads being configured into a rectangular layer, said upper bonding pads being arranged in a matrix, said first lower bonding pad being configured into a rectangular layer, each of said two second lower bonding pads being configured into an L-shaped layer, said two second lower bonding pads cooperating with each other to surround said first lower bonding pad.

6. The chip-scale packaged LED device according to claim 2, wherein said substrate is configured into a square layer, each of said upper bonding pads being configured into a rectangular layer, said upper bonding pads being arranged in a matrix, said first lower bonding pad being configured into an L-shaped layer, each of said two second lower bonding pads being configured into a rectangular layer, said second lower bonding pads being arranged in a row and partially surrounded by said first lower bonding pad.

7. The chip-scale packaged LED device according to claim 1, wherein said lens structure includes a base member disposed on said upper surface of said substrate, and a lens body disposed on said base member, said lens body being configured in a dome shape formed with a plurality of side surface cuts, said lens structure further including a phosphor material that covers said flip-chip LED die(s) and that is surrounded by said base member of said lens structure.

8. The chip-scale packaged LED device according to claim 1, wherein said lens structure includes a base member disposed on said upper surface of said substrate, and a lens body disposed on said base member, said lens body being configured in a dome shape formed with a plurality of side surface cuts, said LED device further comprising at least one identification mark component disposed on said substrate, said base member of said lens structure covering said identification mark component, an orthographic projection of said lens body onto said substrate being not interfered by said at least one identification mark component.

9. The chip-scale packaged LED device according to claim 1, wherein said lens structure includes a base member disposed on said upper surface of said substrate, and a lens body disposed on said base member, said lens body being configured in a dome shape formed with a plurality of side surface cuts, an included angle defined between each of said side surface cuts and an imaginary surface perpendicular to said upper surface of said substrate ranging from 0 degree to 10 degrees.

10. The chip-scale packaged LED device according to claim 1, wherein said lens structure includes a base member disposed on said upper surface of said substrate, and a lens body disposed on said base member, said lens body being configured in a dome shape formed with a plurality of side surface cuts, said lens body having a maximum height (H), an orthographic projection of said lens body onto said substrate having a radius (R), a ratio of said maximum height (H) to said radius (R) ranging from 0.8 to 1.3.

11. The chip-scale packaged LED device according to claim 1, wherein said lens structure includes a base member disposed on said upper surface of said substrate, and a lens body disposed on said base member, said lens body being configured in a dome shape formed with a plurality of side surface cuts, said base member of said lens structure having a thickness ranging from 0.1 mm to 0.7 mm.

12. The chip-scale packaged LED device according to claim 1, further comprising an insulation layer that is disposed on said upper surface of said substrate and disposed between said upper bonding pads to be flush with said upper bonding pads.

13. The chip-scale packaged LED device according to claim 12, further comprising a reflection layer that is provided on at least one of said insulation layer and said upper bonding pads, said reflection layer being formed with at least one opening for receiving said flip-chip LED die(s).

14. The chip-scale packaged LED device according to claim 1, wherein the number of said flip-chip LED dies is greater than two, and a spacing between adjacent two of said flip-chip LED dies is not less than 0.19 mm.

15. A chip-scale packaged LED device, comprising:
- a substrate having an upper surface and a lower surface opposite to said upper surface, and being formed with a plurality of through holes that are defined between said upper and lower surfaces and that penetrate through said substrate;
- an electrical conductive structure including
  - two upper bonding pads that define a first pattern and that are spaced apart from each other and disposed on said upper surface of said substrate,
  - two lower bonding pads that are spaced apart from each other and that are disposed on said lower surface of said substrate, and
  - two interconnectors, each of which is disposed in a corresponding one of said through holes and interconnects said upper and lower bonding pads;
- an insulation layer that defines a second pattern complementary to said first pattern and that is disposed on said upper surface of said substrate, said two upper bonding pads being flush with said insulation layer;
- a flip-chip LED die being disposed on said upper surface of said substrate and being electrically connected to said upper bonding pads, a ratio of a surface area of said flip-chip LED die to an area of said upper surface of said substrate ranging from 22.7% to 76.2%; and
- a lens structure disposed on said upper surface of said substrate and covering said flip-chip LED die.

16. The chip-scale packaged LED device according to claim 15, wherein said lens structure includes a base member disposed on said upper surface of said substrate, and a lens body disposed on said base member, said lens body being configured in a dome shape formed with a plurality of side surface cuts, said LED device further comprising at least one identification mark component disposed on said substrate, said base member of said lens structure covering said identification mark component, an orthographic projection of said lens body onto said substrate being not interfered by said at least one identification mark component.

17. The chip-scale packaged LED device according to claim 15, wherein said lens structure includes a base member disposed on said upper surface of said substrate, and a lens body disposed on said base member, said lens body being configured in a dome shape formed with a plurality of side surface cuts, an included angle defined between each of said side surface cuts and an imaginary surface perpendicular to said upper surface of said substrate ranging from 0 degree to 10 degrees.

18. The chip-scale packaged LED device according to claim 15, wherein said lens structure includes a base member disposed on said upper surface of said substrate, and a lens body disposed on said base member, said lens body being configured in a dome shape formed with a plurality of side surface cuts, said lens body having a maximum height (H), an orthographic projection of said lens body onto said substrate having a radius (R), a ratio of said maximum height (H) to said radius (R) ranging from 0.8 to 1.3.

19. The chip-scale packaged LED device according to claim 15, wherein said lens structure includes a base member disposed on said upper surface of said substrate, and a lens body disposed on said base member, said lens body being configured in a dome shape formed with a plurality of side surface cuts, said base member of said lens structure having a thickness ranging from 0.1 mm to 0.7 mm.

20. The chip-scale packaged LED device according to claim 15, further comprising a reflection layer that is provided on at least one of said insulation layer and said upper bonding pads, said reflection layer being formed with at least one opening for receiving said flip-chip LED die.

* * * * *